US010998284B2

United States Patent
Ghoshal et al.

(10) Patent No.: US 10,998,284 B2
(45) Date of Patent: May 4, 2021

(54) LOW PRESSURE SINTERING POWDER

(71) Applicant: ALPHA ASSEMBLY SOLUTIONS INC., South Plainfield, NJ (US)

(72) Inventors: Shamik Ghoshal, South Plainfield, NJ (US); Nirmalya Kumar Chaki, South Plainfield, NJ (US); Poulami Sengupta Roy, South Plainfield, NJ (US); Siuli Sarkar, South Plainfield, NJ (US); Anubhav Rustogi, South Plainfield, NJ (US)

(73) Assignee: Alpha Assembly Solutions Inc., Somerset, NJ (US)

( * ) Notice: Subject to any disclaimer, the term of this patent is extended or adjusted under 35 U.S.C. 154(b) by 118 days.

(21) Appl. No.: 15/302,827

(22) PCT Filed: Apr. 10, 2015

(86) PCT No.: PCT/GB2015/051096
§ 371 (c)(1),
(2) Date: Oct. 7, 2016

(87) PCT Pub. No.: WO2015/155542
PCT Pub. Date: Oct. 15, 2015

(65) Prior Publication Data
US 2017/0033073 A1 Feb. 2, 2017

(30) Foreign Application Priority Data
Apr. 11, 2014 (IN) .......................... 1023/DEL/2014

(51) Int. Cl.
*H01L 23/00* (2006.01)
*B22F 1/00* (2006.01)
(Continued)

(52) U.S. Cl.
CPC ............ *H01L 24/29* (2013.01); *B22F 1/0003* (2013.01); *B22F 1/0014* (2013.01);
(Continued)

(58) Field of Classification Search
CPC ........ H01L 24/29; H01L 24/27; H01L 24/83; H01L 24/11; H01L 24/32; H01L 24/13; H01L 24/81; H01L 2924/20104; H01L 2924/20103; H01L 2924/20105; H01L 2924/20108; H01L 2924/20102; H01L 2924/20107; H01L 2224/27332;
(Continued)

(56) References Cited

U.S. PATENT DOCUMENTS

2008/0032047 A1* 2/2008 Parashar ............... B22F 1/0018
427/372.2
2012/0104618 A1* 5/2012 Yasuda ................. B22F 1/0014
257/772
(Continued)

FOREIGN PATENT DOCUMENTS

CN 103262172 A 8/2013
EP 3129174 2/2017
(Continued)

Primary Examiner — John A Hevey
(74) Attorney, Agent, or Firm — Stinson LLP

(57) ABSTRACT

A sintering powder comprising:
a first type of metal particles having a mean longest dimension of from 100 nm to 50 μm.

36 Claims, 15 Drawing Sheets

(51) Int. Cl.

| | |
|---|---|
| *B23K 35/02* | (2006.01) |
| *B22F 7/04* | (2006.01) |
| *H01B 1/22* | (2006.01) |
| *B22F 1/02* | (2006.01) |
| *B23K 1/00* | (2006.01) |
| *B23K 35/30* | (2006.01) |
| *B23K 35/36* | (2006.01) |
| *B23K 35/365* | (2006.01) |
| *B23K 101/40* | (2006.01) |
| *B23K 103/00* | (2006.01) |
| *H05K 3/32* | (2006.01) |
| *H01L 25/00* | (2006.01) |
| *H01L 51/52* | (2006.01) |

(52) U.S. Cl.
CPC ............ *B22F 1/0074* (2013.01); *B22F 1/025* (2013.01); *B22F 7/04* (2013.01); *B23K 1/0016* (2013.01); *B23K 35/025* (2013.01); *B23K 35/3006* (2013.01); *B23K 35/3601* (2013.01); *B23K 35/365* (2013.01); *B23K 35/3613* (2013.01); *B23K 35/3618* (2013.01); *H01B 1/22* (2013.01); *H01L 24/11* (2013.01); *H01L 24/13* (2013.01); *H01L 24/27* (2013.01); *H01L 24/32* (2013.01); *H01L 24/81* (2013.01); *H01L 24/83* (2013.01); *B22F 2007/047* (2013.01); *B22F 2301/255* (2013.01); *B22F 2302/45* (2013.01); *B23K 2101/40* (2018.08); *B23K 2103/56* (2018.08); *H01L 24/16* (2013.01); *H01L 24/48* (2013.01); *H01L 24/73* (2013.01); *H01L 24/92* (2013.01); *H01L 25/50* (2013.01); *H01L 51/5246* (2013.01); *H01L 2224/0401* (2013.01); *H01L 2224/04026* (2013.01); *H01L 2224/05155* (2013.01); *H01L 2224/05644* (2013.01); *H01L 2224/11003* (2013.01); *H01L 2224/1132* (2013.01); *H01L 2224/11334* (2013.01); *H01L 2224/131* (2013.01); *H01L 2224/1339* (2013.01); *H01L 2224/1349* (2013.01); *H01L 2224/13339* (2013.01); *H01L 2224/13347* (2013.01); *H01L 2224/13355* (2013.01); *H01L 2224/13387* (2013.01); *H01L 2224/13439* (2013.01); *H01L 2224/13499* (2013.01); *H01L 2224/16227* (2013.01); *H01L 2224/271* (2013.01); *H01L 2224/27003* (2013.01); *H01L 2224/27332* (2013.01); *H01L 2224/27436* (2013.01); *H01L 2224/27505* (2013.01); *H01L 2224/2929* (2013.01); *H01L 2224/2939* (2013.01); *H01L 2224/2949* (2013.01); *H01L 2224/29339* (2013.01); *H01L 2224/29347* (2013.01); *H01L 2224/29355* (2013.01); *H01L 2224/29387* (2013.01); *H01L 2224/29439* (2013.01); *H01L 2224/29499* (2013.01); *H01L 2224/32145* (2013.01); *H01L 2224/32146* (2013.01); *H01L 2224/32225* (2013.01); *H01L 2224/32245* (2013.01); *H01L 2224/48227* (2013.01); *H01L 2224/48247* (2013.01); *H01L 2224/73265* (2013.01); *H01L 2224/8121* (2013.01); *H01L 2224/81075* (2013.01); *H01L 2224/8184* (2013.01); *H01L 2224/81192* (2013.01); *H01L 2224/81203* (2013.01); *H01L 2224/81948* (2013.01); *H01L 2224/8321* (2013.01); *H01L 2224/83075* (2013.01); *H01L 2224/8384* (2013.01); *H01L 2224/83191* (2013.01); *H01L 2224/83192* (2013.01); *H01L 2224/83203* (2013.01); *H01L 2224/83439* (2013.01); *H01L 2224/83447* (2013.01); *H01L 2224/83948* (2013.01); *H01L 2224/92247* (2013.01); *H01L 2224/94* (2013.01); *H01L 2924/00014* (2013.01); *H01L 2924/0665* (2013.01); *H01L 2924/12041* (2013.01); *H01L 2924/12044* (2013.01); *H01L 2924/1461* (2013.01); *H01L 2924/206* (2013.01); *H01L 2924/2011* (2013.01); *H01L 2924/2064* (2013.01); *H01L 2924/20102* (2013.01); *H01L 2924/20103* (2013.01); *H01L 2924/20104* (2013.01); *H01L 2924/20105* (2013.01); *H01L 2924/20106* (2013.01); *H01L 2924/20107* (2013.01); *H01L 2924/20108* (2013.01); *H01L 2924/20109* (2013.01); *H05K 3/321* (2013.01)

(58) Field of Classification Search
CPC ..... H01L 2924/0665; H01L 2924/2011; H01L 2924/2064; H01L 2924/20106; H01L 2224/27505; H01L 2924/20109; H01L 2224/2929; H01L 2924/206; H01L 51/5246; H01L 24/73; H01L 2224/92247; H01L 2224/48247; H01L 2224/48227; H01L 24/92; H01L 2224/73265; H01L 2224/13439; H01L 2224/11003; H01L 2224/83203; H01L 2924/12041; H01L 2224/2939; H01L 2224/29387; H01L 2224/81192; H01L 2224/29339; H01L 2224/13499; H01L 2224/1349; H01L 2224/32245; H01L 2224/8121; H01L 2224/13355; H01L 2224/1132; H01L 2224/0401; H01L 2224/29499; H01L 2224/81948; H01L 2224/83948; H01L 2224/2949; H01L 2224/05644; H01L 2224/16227; H01L 2224/83191; H01L 2224/13339; H01L 2224/81075; H01L 2224/29347; H01L 2224/83447; H01L 2924/1461; H01L 2224/94; H01L 2224/32145; H01L 2224/83439; H01L 2924/00014; H01L 2224/29439; H01L 24/48; H01L 25/50; H01L 2224/83192; H01L 2224/32225; H01L 2224/8184; H01L 2224/29355; H01L 2224/131; H01L 2224/1339; H01L 24/16; H01L 2224/83075; H01L 2224/04026; H01L 2224/13387; H01L 2224/13347; H01L 2924/12044; H01L 2224/271; H01L 2224/32146; H01L 2224/27003; H01L 2224/81203; H01L 2224/8321; H01L 2224/27436; H01L 2224/05155; H01L 2224/11334; H01L 2224/8384; B22F 1/025; B22F 1/0003; B22F 1/0074; B22F 7/04; B22F 1/0014; B22F 2302/45; B22F 2301/255; B22F 2007/047; B23K 35/3601; B23K 35/3006; B23K 1/0016; B23K 35/365; B23K 35/3618; B23K 35/3613; B23K 35/025; B23K 2101/40; B23K 2103/56; H01B 1/22; H05K 3/321
See application file for complete search history.

(56) References Cited

U.S. PATENT DOCUMENTS

2012/0114927 A1* 5/2012 Khaselev ................ H01L 24/27
 428/220
2012/0129332 A1* 5/2012 Reddington ......... C09D 11/322
 438/610

(56) References Cited

U.S. PATENT DOCUMENTS

| | | | | |
|---|---|---|---|---|
| 2012/0153011 A1* | 6/2012 | Schafer | ............... | B22F 1/0062 |
| | | | | 228/248.1 |
| 2012/0219787 A1* | 8/2012 | Jun | .................. | H01B 1/22 |
| | | | | 428/328 |
| 2015/0353804 A1* | 12/2015 | Ghosal | ................. | B82Y 30/00 |
| | | | | 419/8 |
| 2017/0033073 A1 | 2/2017 | Ghoshal et al. | | |

FOREIGN PATENT DOCUMENTS

| | | |
|---|---|---|
| JP | 2008161907 | 7/2008 |
| JP | 2011080147 | 4/2011 |
| JP | 2014-503936 | 2/2014 |
| KR | 20110003149 | 1/2011 |
| WO | 2009012450 | 1/2009 |
| WO | 2012/061511 | 5/2012 |
| WO | 2014068299 | 5/2014 |
| WO | 2015/155542 | 10/2015 |

* cited by examiner

LOW PRESSURE SINTERING POWDER

The invention relates to a sintering powder, a sintering paste and film comprising the sintering powder, and a sintered joint formed using the same.

Sintered joints provide an alternative to soldered joints. A typical method of forming a sintered joint involves placing a metal powder, often in the form of a powder compact, between two work pieces to be joined and then sintering the metal powder. The resulting atomic diffusion of the metal atoms forms a bond between the two work pieces.

Metal nanopowders have been used to form sintered joints in the electronics industry, and are considered to be useful alternatives to lead-free soldering. The differing behaviour between nanomaterials and the corresponding bulk material is thought to be due to nanomaterials having a higher surface-to-volume ratio.

Sintering powders containing silver nanoparticles are known. Sintered joints formed by atomic diffusion of silver nanoparticles can be processed at a temperature significantly lower than the melting temperature of the bulk and can also be used for high temperature applications. The potential advantages, such as high temperature stability, high electrical and thermal conductivity, and good mechanical properties, make such sintering powders promising candidates for die attachment applications. However, the sintering temperatures of such sintering powders are still too high for effective use in most electronics applications.

Sintering temperatures may be reduced by applying an external pressure during sintering. Pressure-assisted low-temperature sintering of silver paste has been shown to be a viable alternative to solder reflow as a die-attachment method. The application of high pressure has been shown to significantly lower the sintering temperature, and the desired properties for die attachment can be achieved at a relatively faster rate resulting in the formation of a sintered joint within a few minutes. However, a large external pressure makes automation of the process difficult. Furthermore, application of a large external pressure may result in damage to the work pieces.

It is known to dispense solder paste for a variety of applications, but mostly as an alternative when wave solder or screen printing is not possible. Solder paste can be dispensed on a variety of surface mount applications on printed circuit boards, integrated circuit packages, and electrical component connectors. Typical problems of solder paste include: dripping, skipped dots, and inconsistent dispensing. Soft and hard solders are typically used in the electronic industries for die attached and dispensing. The soft solders are susceptible to fatigue failure under thermal cycling conditions. On the other hand, hard solders and glass matrix composites are used to enable devices to run at higher junction temperatures, but their higher elastic moduli and processing temperatures can generate high mechanical stresses in devices, and these materials also have relatively low thermal and electrical conductivities.

The present invention seeks to tackle at least some of the problems associated with the prior art or at least to provide a commercially acceptable alternative solution thereto.

In a first aspect, the present invention provides a sintering powder comprising:
a first type of metal particles having a mean longest dimension of from 100 nm to 50 μm.

Each aspect or embodiment as defined herein may be combined with any other aspect(s) or embodiment(s) unless clearly indicated to the contrary. In particular, any features indicated as being preferred or advantageous may be combined with any other feature indicated as being preferred or advantageous.

The term "sintering powder" as used herein may encompass a powder capable of forming a sintered joint. Sintered joints are formed by atomic diffusion of metal particles placed between two work pieces to be joined. The term "sintering powder" may encompass a particulate. The sintering powder may comprise regular shaped particles (such as, for example, spheres) or irregular shaped particles (such as, for example, whiskers, plates, rods or flakes).

The term "capping agent" as used herein may encompass a species that, when present on the surface of metal particles, reduces agglomeration of the metal particles, enables particle size control during powder production and reduces particles' surface oxidation or other contamination.

The inventors have surprisingly found that the sintering powder as described herein may be sintered at low temperatures with the application of only very low pressure, typically substantially no pressure. As a result, formation of a sintered joint between work pieces using the sintering powder may occur with reduced damage to the work pieces. In addition, since the application of high pressures is not required, the formation of a sintered joint is simplified, and may be more easily automated. Furthermore, in contrast to nano-sized particles, agglomeration of the first type of metal particles can be avoided by the use of only low amounts of capping agent. Accordingly, in contrast to sintering powders comprising nano-sized particles only, the amount of residual organics contained in a resulting sintered joint is reduced, thereby improving the mechanical properties of the joint.

The first type of metal particles has a mean longest dimension of from 100 nm to 50 μm. Mean longest dimensions bigger than 50 μm may result in a low surface-to-volume ratio, thereby requiring higher sintering temperatures and/or pressures. Mean longest dimensions smaller than 100 nm may require unfavourable levels of capping agent. Typically most of the particles of the first type of metal particles have a longest dimension of from 100 nm to 50 μm, more typically substantially all of the particles forming the first type of metal particles have a longest dimension of from 100 nm to 50 μm. When the particles forming the particulate are spherical, the longest dimension will be the diameter of the sphere. The mean longest diameters referred to herein may be measured with a particle size analyser using either a dynamic light scattering method or laser scattering method.

The first type of metal particles may all comprise the same metal. Alternatively, some of the particles may comprise different metals. In addition, individual particles may comprise two or more different metals. The term "metal" as used herein may encompass alloys or core-shell structures. Accordingly, the particles may comprise one or more alloys or alloys or core-shell structures of one or more metals.

Preferably, at least a portion of the first type of metal particles are at least partially coated with a capping agent. The use of a capping agent may help to reduce agglomeration of the particles. Such agglomeration is unfavourable, since it may increase the sintering temperature of the sintering powder. Accordingly, the use of a capping agent enables the formation of a sintered joint between work pieces at lower temperatures and, therefore, may help to reduce damage to a work piece caused by exposure to high sintering temperatures. In addition, the use of a capping agent may help to avoid degradation of the metal such as, for example, damage caused by exposure of the metal to air.

In this embodiment, the metal particles may be substantially coated with the capping agent, or completely coated with a capping agent. Increasing the coverage of the capping agent on the metal particles may help to further reduce the agglomeration of the metal particles and, therefore, further reduce the sintering temperature. In addition, most of the metal particles may be coated with the capping agent, or substantially all of the metal particles may be coated with a capping agent.

The capping agent preferably comprises a carboxylate and/or amine functional group.

The sintering powder preferably comprises up to 5 wt % capping agent, more preferably from 0.1 to 3 wt % capping agent, even more preferably about 0.5 wt % capping agent. The term "wt %" used in this regards is based on the total weight of the sintering powder. If the sintering powder comprises more than 5 wt % capping agent, then higher temperatures may be required to melt the capping agent prior to sintering. Furthermore, the amount of organics contained in the resulting sintered joint may increase. If the sintering powder comprises less than 0.1 wt % capping agent, then the capping agent may not adequately cover the surface of the metal. This may result in an increase in agglomeration of the particles and, therefore, an increase in the sintering temperature. The combination of the size of the first type of metal particles and the low levels of capping agent may result in a combination of a strong resulting joint, low required sintering temperatures and pressures and reduced agglomeration of the particles.

The first type of metal particles preferably has a mean longest diameter of from 100 nm to 20 μm, more preferably from 150 nm to 15 μm, even more preferable from 200 nm to 10 μm.

The first type of metal particles preferably has a D50 value (i.e. the value of the particle diameter at 50% in the cumulative distribution) of from 1 to 3 μm. This may provide particularly favourable sintering characteristics. The D50 may be measured with a particle size analyser using either a dynamic light scattering method or laser scattering method.

The first type of metal particles preferably has a tap density of from 3.5 to 5.5 g/cc. The tap density may be measured under the standard procedure using a tap density meter. Higher tap densities indicate presence of less degree of agglomeration of the metal particles prior to sintering.

The sintering powder may comprise a second type of metal particles having a mean longest dimension of less than 100 μm, wherein the second type of metal particles are at least partially coated with a capping agent. The combination of the first and second types of metal particles increases the contact points of the particles forming the sintering powder. This may result in better sintering and also an improved morphology of the powder. Accordingly, the thermocycling properties of a joint formed using such a powder are improved. In addition, the larger first type of particles typically require only low levels of capping agent. Accordingly, in comparison to a sintering powder comprising only nano-sized particles, the total amount of capping agent in the sintering powder may be reduced, thereby minimising the existence of residual organics in any formed joint. As a result, the thermoconductivity and high temperature properties, such as thermocycling, are improved. Typically most of the particles of the second type of metal particles have a longest dimension of less than 100 μm, more typically substantially all of the particles forming the second type of metal particles have a longest dimension of less than 100 μm.

In one embodiment, the second type of metal particles preferably has a mean longest dimension of from 1 to 100 nm, preferably from 5 to 75 nm. In this embodiment, typically most of the particles of the second type of metal particles have a longest dimension within these ranges, more typically substantially all of the particles forming the second type of metal particles have a longest dimension within these ranges.

The sintering powder preferably comprises from 1 to 19 wt % of the first type of metal particles and from 81 to 99 wt % of the second type of metal particles, preferably from 5 to 15 wt % of the first type of metal particles and from 85 to 95 wt % of the second type of metal particles. Such ranges are particularly suitable for providing the combination of improved thermoconductivity and thermocycling properties, and low sintering temperature. In a preferred embodiment, the particulate comprises about 10 wt % of the first type of particles and about 90 wt % of the second type of particles The first type of metal particles and/or second type of metal particles preferably comprises silver or an alloy or alloys or core-shell structures thereof. Silver has excellent electrical and thermal conductivity, and is therefore capable of forming a sintered joint with high electrical and/or thermal conductivity. Accordingly, the use of silver metal makes the sintering powder particularly suitable for use in electronics applications, such as die attachment and microelectronic packaging. Suitable silver alloys include, for example, AgSn, AgPd, AuAg, AgCu and AgNi. The metal particles may comprise core-shell structures of silver coated particles such as, for example, silver coated copper, silver coated nickel, silver coated CuNi, silver coated CuNiZn and silver coated BN.

The capping agent of the first type of metal particles may be inorganic and/or organic. Examples of organic capping agents include polymers and ligands. Preferably the capping agent of the first type of metal particles comprises an amine and/or a carboxylate functional group. Such capping agents may form a weak bond with the metal particles. Accordingly the temperature required to break the bonding may be reduced, which may help to reduce the sintering temperature. Capping agents that comprise an acid functional group are particularly preferred in this regard.

Preferably the capping agent of the first type of metal particles comprises a straight chain carboxylic acid (C6 to C22) or a branched chain aliphatic carboxylic acid. One preferred example is oleic acid. Oleic acid forms a particularly weak bond with metal particles. In addition, oleic acid is particularly effective at reducing agglomeration of metal particles.

The capping agent of the second type of metal particles may be inorganic and/or organic. Examples of organic capping agents include polymers and ligands. Preferably the capping agent of the second type of metal particles comprises an amine and/or a carboxylate functional group. Such capping agents may form a weak bond with the metal particles. Accordingly the temperature required to break the bonding may be reduced, which may help to reduce the sintering temperature. Capping agents that comprise an amine functional group are particularly preferred in this regard.

Preferably the capping agent of the second type of metal particles comprises a straight chain alkylamine (C6 to C18) or a branched chain aliphatic alkylamine. One preferred example is octylamine. Octylamine forms a particularly weak bond with metal particles. In addition, octylamine is particularly effective at reducing agglomeration of metal particles.

In a particularly preferred embodiment, the sintering powder comprises:
- from 1 to 10 wt % of a first type of metal particles having a mean longest dimension of from 100 nm to 20 μm, the metal particles at least partially coated with an oleic acid capping agent; and
- from 90 to 99 wt % of a second type of metal particles having a mean longest dimension of from 5 to 75 nm, wherein the second type of metal particles are at least partially coated with an octylamine capping agent.

In a further aspect, the present invention provides a sintering powder comprising:
- metal particles having a mean longest dimension of less than 10 μm,
wherein at least some of the metal particles are at least partially coated with a capping agent.

Such a sintering powder may be sintered at particularly low temperatures with the application of only very low pressure, typically substantially no pressure. As a result, formation of a sintered joint between work pieces using the sintering powder may occur with reduced damage to the work pieces. In addition, since the application of high pressures is not required, the formation of a sintered joint is simplified, and may be more easily automated.

Preferably the metal particles have a mean longest dimension of from 1 to 100 nm, more preferably from 5 to 75 nm, even more preferably from 5 to 65 nm. Such mean longest dimensions may be particularly effective at providing a high surface-to-volume ratio. Metal particles having a mean longest dimension smaller than 1 nm may be difficult to handle and may also be more susceptible to degradation.

The metal particles may have a mean longest dimension of from 500 nm to 5 μm. Larger particle sizes may require less capping agent. Accordingly, due to the reduction in residual organics in the resulting joint, the resistivity is much lower. In one aspect of the present invention, the metal particles have a mean longest diameter of from 100 nm to 10 μm, preferably from 500 nm to 3 μm and comprise less than 3 wt % capping agent, typically about 0.5 wt % capping agent.

When the metal particles have a mean longest dimension in the ranges specified above, typically most of the particles have a longest dimension within the range, more typically substantially all of the particles have a longest dimension within the range.

The particulate typically exhibits heterogeneous particle sizes. For example, the difference between the mean longest dimension of the largest 10% of the particles and mean longest dimension of the smallest 10% of the particles may be greater than 20 nm, typically greater than 30 nm, even more typically greater than 60 nm, still even more typically from 60 to 150 nm. The heterogeneous particle sizes may help to reduce the sintering temperature of the sintering powder, presumably due to the large point of contact between the particles. In addition, such heterogeneous sizes may help to increase the packing fraction.

The capping agent may be inorganic and/or organic. Examples of organic capping agents include polymers and ligands. Preferably the capping agent comprises an amine and/or a carboxylate functional group. Such capping agents may form a weak bond with the metal particles. Accordingly the temperature required to break the bonding may be reduced, which may help to reduce the sintering temperature. Capping agents that comprise an amine functional group are particularly preferred in this regard.

Preferably the capping agent comprises straight chain alkylamine (C6 to C18) or a branched chain aliphatic alkylamine. One preferred example is octylamine. Octylamine forms a particularly weak bond with metal particles. In addition, octylamine is particularly effective at reducing agglomeration of metal particles.

The metal preferably comprises silver or an alloy or alloys or core-shell structures thereof. Silver has excellent electrical and thermal conductivity, and is therefore capable of forming a sintered joint with high electrical and/or thermal conductivity. Accordingly, the use of silver metal makes the sintering powder particularly suitable for use in electronics applications, such as, for example, die attachment and microelectronic packaging. Alternatively, the metal may comprise other metals such as, for example, copper and gold.

In a further aspect, the present invention provides a sintering powder comprising:
- a particulate having a mean longest diameter of less than 10 μm, wherein at least some of the particles forming the particulate comprise a metal at least partially coated with a capping agent.

In a further aspect, the present invention provides A sintering powder comprising:
- a particulate having a mean longest diameter of less than 10 μm, wherein at least some of the particles forming the particulate comprise a metal at least partially coated with a capping agent, wherein the particulate comprises a first type of particles having a longest diameter of from greater than 100 nm to 50 μm and a second type of particles having a longest diameter of from 1 to 100 nm, wherein the particulate comprises from 5 to 15 wt % of the first type of particles and from 85 to 95 wt % of the second type of particles.

In a further aspect, the present invention provides a sintered joint formed using the sintering powder as described herein. Such a sintered joint may exhibit particularly high strength and/or particularly high electrical and thermal conductivity. Furthermore, the sintered joint may exhibit very little change in shear strength following thermal shock, typically substantially no change in shear strength.

In a further aspect, the present invention provides an LED (light-emitting diode), MEMS (microelectromechanical system), °LED (organic light-emitting diode) or PV cell (photovoltaic cell) comprising the sintered joint described herein.

In a further aspect the present invention provides a sintering paste comprising:
- the sintering powder as described herein;
- a binder;
- a solvent; and
- optionally a rheology modifier and/or an organosilver compound and/or an activator and/or a surfactant and/or wetting agent and/or hydrogen peroxide or organic peroxides.

The paste may be printable and/or dispensable and/or jettable and/or pin transferable. The paste may have viscosity and flow characteristics particularly favourable for dispensing, meaning that the paste may be used as a one-to-one replacement for solders.

Compared to sintering pastes known in the art, the sintering paste of the present invention exhibits high stability at room temperature. This means that low temperature storage of the sintering paste is not required. This is a particularly important advantage of the sintering paste of the present invention.

The binder and/or solvent are typically selected so that they are able to be removed from the paste (for example by evaporation and/or burn out) at a temperature below the targeted sintering temperature of the sintering powder. This may help to promote near complete sintering of the metal particles. When organic material remains in the joint during sintering, inadequate sintering of the metal particles may occur. This may result in a weak sintered joint.

The binder may serve to bind the paste together so that it is easier to handle and position accurately in the location of a desired sintered joint. Examples of suitable binders include, but are not restricted to, thermoplastic polymers, such as, for example, poly(methyl methacrylate), polyamides, polyethylene, polypropylene, polystyrene; or thermosetting polymers, such as, for example, polyurethanes, polycyanurates, epoxy resin, polyimides, melamine resin and bismaleimide resin. Particularly preferred examples include hydroxypropylmethylcellulose, triacetin and polyvinyl acetate. Preferably the binder comprises an epoxy-based resin. Epoxy-based resin may be particularly effective at binding the paste together so that the paste is easier to handle and may be easier to position accurately in the location of a desired sintered joint. Furthermore, the use of epoxy resin may result in the formation of a stronger joint prior to sintering, meaning that there is no requirement to hold together the work pieces to be joined prior to sintering. The use of epoxy resin is particularly advantageous when the capping agent comprises an amine functional group. In this case, the amine acts as a hardener forming a cross-linked structure. This may result in a particularly strong joint prior to sintering.

The solvent preferably comprises a monoterpene alcohol and/or a glycol and/or glycol ether, preferably terpineol and/or diethylene glycol mono-n-butyl ether. Monoterpene alcohol and/or a glycol ether may be particularly effective at dispersing the metal particles within the paste, resulting in a homogeneous distribution of metal particles in the matrix of organic components with reduced cluster aggregation and/or agglomeration. The use of monoterpene alcohol and/or a glycol ether may serve to increase the flow-ability and printer-ability of the sintering paste.

A rheology modifier may be added to control the viscosity of the paste. Examples of suitable rheology modifiers include, but are not restricted to, short or long chain (C=2 to 30) carboxylic acids or di-carboxylic acids or hydroxyl carboxylic acids, for example lauric acid, stearic acid, neodecanoic acid, stearic acid, oleic acid, oxalic acid, malonic acid, succinic acid, adipic acid, maleic acid, citric acid, lactic acid or short or long chain (C=2 to 30) amines, for example, butyl amine, hexyl amine, octyl amine, dodecyl amine, hexadecyl amine, Thixcin R and Crayvallac Super, or combinations of two or more thereof.

During sintering, the organosilver compound may break down to metallic silver, which may increase the thermal conductivity of the sintered joint. In addition, the presence of the organosilver compound increases the wetting of the paste to the joint interface. The organosilver compound may comprise one or more of short or long chain carboxylic acids (C=1 to 30), such as, for example, silver stearate, silver palmitate, silver oleate, silver laurate, silver neodecanoate, silver decanoate, silver octanoate, silver hexanoate, silver lactate, silver oxalate, silver citrate, silver acetate and silver succinate. In some embodiments, the organosilver compound may be omitted.

An activator may be added to remove any metal oxide that may be present from the surface being printed and/or to remove any oxides that may be present in the sintering powder. Aryl or alkyl carboxylic acids may be used as activators, such as, for example, one or more of adipic acid, succinic acid and glutaric acid.

A surfactant may be added to the sintering paste to help disperse the sintering powder in the sintering paste. Examples of suitable surfactants include, but are not restricted to, Disperbyk 163, IGEPAL CA-630, lauryl glucoside and TritonX 100.

The sintering paste preferably further comprises a peroxide. Examples of suitable peroxides include, but are not restricted to, hydrogen peroxide or organic peroxides, such as, for example, tertiary-butyl hydroperoxide and tertiary-butyl peroxy-2-ethylhexanoate. Peroxide introduces oxygen into the paste, which may aid sintering of the paste beneath the die area in a die attach method. The oxygen may also enable sintering of the metal particles under an inert atmosphere, such as, for example, a nitrogen atmosphere. The sintering paste preferably comprises up to 3 wt. % hydrogen peroxide or organic peroxides, preferably from 0.5 to 2 wt. % hydrogen peroxide or organic peroxides, more preferably from 0.7 to 1.8 wt. % hydrogen peroxide or organic peroxides. Liquid peroxides are preferred to control rheology and silver settling.

The sintering paste preferably comprises:
from 1 to 15 wt % binder; and/or
from 1 to 30 wt % solvent; and/or
up to 5 wt % rheology modifier; and/or
up to 10 wt % an organosilver compound; and/or
up to 2 wt % activator; and/or
up to 6 wt % surfactant; and/or
up to 2 wt % hydrogen peroxide or organic peroxides.

Binder and/or solvent contents within these ranges may help to provide the sintering paste with particularly desirable flow-ability and printer-ability. Preferably the sintering paste comprises from 2 to 8 wt, binder. In one embodiment the sintering paste comprises about 4.5 wt % binder. Preferably the sintering paste comprises from 5 to 30 wt %, solvent. In one embodiment the sintering paste comprises about 26 wt % solvent. The sintering paste may comprise 0 to 5 wt % rheology modifier and/or 0 to 2 wt % activator and/or 0 to 6 wt % surfactant and/or 0 to 2 hydrogen peroxide or organic peroxides. The sintering paste may comprise from 62 to 90 wt % sintering powder. The sintering powder may form the balance of the sintering paste.

In a further aspect the present invention provides a sintering paste comprising:
the sintering powder as disclosed herein;
an organosilver compound;
a solvent; and
optionally an activator and/or rheology modifier and/or surfactant and/or hydrogen peroxide or organic peroxides.

During sintering, the organosilver compound may break down to metallic silver, which may increase the thermal conductivity of the sintered joint. In addition, the presence of the organosilver compound increases the wetting of the paste to the joint interface. The organosilver compound may comprise one or more of short or long chain carboxylic acids (C=1 to 30), such as, for example, silver stearate, silver palmitate, silver oleate, silver laurate, silver neodecanoate, silver decanoate, silver octanoate, silver hexanoate, silver lactate, silver oxalate, silver citrate, silver acetate and silver succinate. In some embodiments, the organosilver compound may be omitted.

The sintering paste preferably further comprises a fatty acid and/or wetting agent, preferably one or more of: short or long chain (C=2 to 30) carboxylic acids or di-carboxylic acids or hydroxyl carboxylic acids, more preferably lauric acid, stearic acid, neodecanoic acid, stearic acid, oleic acid, oxalic acid, malonic acid, succinic acid, adipic acid, maleic acid, citric acid or lactic acid; or short or long chain (C=2 to 30) amines, more preferably butyl amine, hexyl amine, octyl amine, dodecyl amine or hexadecyl amine; or surfactants, more preferably triton X100, IGEPAL CA-630 or lauryl glucoside. The presence of fatty acids helps to bind the paste together. In other words, the presence of a fatty acid avoids the need for a separate binder, such as the epoxy based resin binder discussed above. Accordingly, the total amount of organics in the paste is less, resulting in a stronger final joint.

The sintering paste preferably further comprises a peroxide. Examples of suitable peroxides include, but are not restricted to, hydrogen peroxide or organic peroxides, such as, for example, tertiary-butyl hydroperoxide and tertiary-butyl peroxy-2-ethylhexanoate. Peroxide introduces oxygen into the paste, which may aid sintering of the paste beneath the die area in a die attach method. The oxygen may also enable sintering of the metal particles under an inert atmosphere, such as, for example, a nitrogen atmosphere. The sintering paste preferably comprises up to 3 wt. % hydrogen peroxide or organic peroxides, preferably from 0.5 to 2 wt. % hydrogen peroxide or organic peroxides, more preferably from 0.7 to 1.8 wt. % hydrogen peroxide or organic peroxides. Liquid peroxides are preferred to control rheology and silver settling.

The sintering paste may comprise a film forming agent such as, for example, a polyamide, polyisobutylene, polyamide wax rheology modifier and castor oil based thixotropes.

Preferably the sintering paste is substantially resin free, more preferably completely resin free. The presence of resin may reduce the thermal and electrical conductance of the silver. The solvent preferably comprises a monoterpene alcohol and/or a glycol and/or glycol ether, more preferably a terpineol and/or diethylene glycol mono-n-butyl ether.

The sintering paste preferably comprises:
from 1 to 30 wt % solvent; and/or
up to 50 wt % organosilver compound, preferably from 0.1 to 25 wt %, more preferably from 0.1 to 10 wt %, even more preferably from 0.1 to 9 wt %; and/or
up to 5 wt % rheology modifier; and/or
up to 2 wt % activator; and/or
up to 6 wt % surfactant; and/or
up to 2 wt % hydrogen peroxide or organic peroxides.

The sintering paste may comprise 0 to 5 wt % rheology modifier and/or 0 to 2 wt % activator and/or 0 to 6 wt % surfactant and/or 0 to 2 hydrogen peroxide or organic peroxides. The sintering powder may form the balance of the sintering paste.

In a further aspect the present invention provides a sintering film comprising the sintering powder as described herein and a binder. The film may be applied at the wafer level, die level, package/substrate level, and/or module level. Such a film may be obtained, for example, by printing the sintering paste as described herein onto a polyester sheet, heating the paste to at least partially remove the solvent and form a film, and then removing the film from the polyester sheet. The film as described herein is especially advantageous since it can be transferred on the die by simply pressing the die on to the film at slightly elevated temperature. Transferred film is an alternate application method, beneficially offered in certain situations. The film may be formed on a polymeric, glass, metal or ceramic substrate or directly on a wafer. The film may be on a polymeric substrate comprising polyester. The film may be formed on a polymeric substrate, wherein the polymeric substrate comprises a release coating. The film may be produced by applying the paste compositions by printing or casting of the material. The film may be produced by printing in a continuous layer. Alternatively, the film may be produced by printing to form an array of discrete shapes.

In a further aspect the present invention provides a method of die attachment comprising:
(i) placing the sintering film described herein between a die and a substrate to be joined; and
(ii) sintering the sintering film, wherein the sintering is carried out without the application of pressure.

This "low pressure" or "pressureless" sintering is particularly advantageous, since it may make automation of the process simpler. Furthermore, damage to the work pieces may be reduced. Further advantages over methods employing pressured sintering include: shorter time required for die-placement (high UPH), low-pressure requirement for placement (highly advantageous for processing thin wafers), compatibility with commercial die-bonder and sintering in external heating equipment (batch process to improve UPH).

The sintering is preferably carried out at a temperature of from 150 to 400° C. for up to 120 minutes. Such conditions may result in particularly effective sintering of the sintering film while avoiding damage to the work pieces.

Step preferably (i) comprises:
(a) applying the sintering film to the die to form an assembly having a die side and a sintering film side; and
(b) contacting the film side of the assembly with the substrate.

Such a step may make automation of the process simpler, and may be carried out, for example, by the use of a stamp.

Step (a) is preferably carried out at a temperature of from 15 to 400° C. and a pressure of from 0.1 to 5 MPa for from 0.1 to 60 seconds. Such conditions may result in particularly effective application of the sintering film while avoiding damage to the die.

Step (b) is preferably carried out at a temperature of from 15 to 400° C. and a pressure of from 0.1 to 40 MPa for from 0.1 to 60 minutes. Such conditions may result in particularly effective contacting of the die to the substrate while avoiding damage to the die or substrate.

In a further aspect, the present invention provides a method of die attachment comprising:
(i) placing the sintering film described herein between a die and a substrate to be joined; and
(ii) sintering the sintering film, wherein the sintering is carried out while applying a pressure of from 0.1 to 40 MPa.

In a further aspect, the present invention provides a method of wafer bonding comprising:
(i) placing the sintering film described herein between two or more wafers to be joined; and
(ii) sintering the sintering film, wherein the sintering is carried out without the application of pressure.

In a further aspect, the present invention provides a method of transferring a sintering film to a component, comprising:
applying the sintering film described herein to a substrate to form an assembly having a sintering film side and a substrate side;
contacting the sintering film side of the assembly with a component;
heating the assembly to a temperature of from 50 to 200° C.;
applying a pressure of from 1 to 5 MPa to the assembly for from 0.1 seconds to 60 minutes; and
separating the substrate from the sintering film.

The substrate may be polymeric. The sintering film may be substantially the same size as the component. The component may be an LED.

In a further aspect the present invention provides a method for die-attachment, comprising: applying the sintering film described herein to a substrate; placing a die on the film to form an assembly; applying a pressure of less than 2 MPa to the assembly; and sintering the assembly at a temperature of 100 to 400° C. for 0.1 s to 5 minutes, applying a pressure of less than 3 MPa. The same assembly may be further sintered at a temperature of 175 to 400° C. in a pressureless manner using variety of processes and equipment that provide appropriate degree of heat to initiate and complete sintering.

In a further aspect the present invention provides a method for die-attachment attachment, comprising: applying the sintering film described herein to a substrate; placing a die on the film to form an assembly; applying a pressure of less than 5 MPa to the assembly; and sintering the assembly at a temperature of 100 to 400° C. for 0.1 s to 60 minutes, applying a pressure of less than 40 MPa. The same assembly may be further sintered at a temperature of 175 to 400° C. in a pressureless manner using variety of processes and equipment that provide appropriate degree of heat to initiate and complete sintering.

In a further aspect the present invention provides a method for die-attachment attachment, comprising: applying the sintering film described herein on a back side of a wafer; dicing the wafer to form a plurality of die; placing at least one die on a substrate to form an assembly; applying a pressure of more than 1 MPa to the assembly; and sintering the assembly at a temperature of 100 to 400° C. for 0.1 s to 60 minutes. The same assembly may be further sintered at a temperature of 175 to 400° C. in a pressureless manner using variety of processes and equipment that provide appropriate degree of heat to initiate and complete sintering.

In a further aspect the present invention provides a method for wafer bonding, comprising: applying the sintering film described herein on a back side of a wafer; placing one more same or different types of wafer on the sinterable Ag film containing wafer to form an assembly; applying a pressure of more than >0.1 MPa to the assembly; and sintering the assembly at a temperature of 100 400° C. for 0.25 s to 120 minutes. The same assembly may be further sintered at a temperature of 175 to 400° C. in a pressureless manner using variety of processes and equipment that provide appropriate degree of heat to initiate and complete sintering.

In a further aspect the present invention provides a method for wafer bonding, comprising: applying the sintering film on a back side of a wafer; placing one more same or different types of wafer on the sintering film containing wafer to form an assembly; applying a pressure of less than 40 MPa to the assembly; and sintering the assembly at a temperature of 100 to 400° C. for 0.25 s to 120 minutes. The same assembly may be further sintered at a temperature of 175 to 400° C. in a pressureless manner using variety of processes and equipment that provide appropriate degree of heat to initiate and complete sintering.

In a further aspect the present invention provides the use of the sintering powder as described herein or the sintering paste or film as described herein in a method selected from: die attachment (e.g. chip-to-board, chip-to-substrate, chip-to-heat sink, chip-to-fixture), wafer-to-wafer bonding (e.g. chip-to-heat sink), reflective layer printing, hermetic and near hermetic sealing (for example for packages and perimeter seals), the production of interconnect lines (for example circuitry, pads), via filling in semiconductor devices and substrates, and flip-chip and wafer bumping.

In a further aspect the present invention provides a method of manufacturing a sintered joint comprising the steps:
providing the sintering powder as described herein or the sintering paste or film as described herein in the vicinity of two or more work pieces to be joined; and
heating the sintering powder or sintering paste or film to at least partially sinter the metal.

Advantageously, the heating step may be carried out at atmospheric pressure. The sintering powder or sintering paste or film may be placed in the vicinity of the work piece under low pressure (typically 1-5 MPa for 0.1 to 60 seconds at a temperature of about 175 to 250° C.).

The heating step is preferably carried out at a temperature of at least 140° C., more preferably from 150 to 350° C., even more preferably from 160 to 300° C. Temperatures lower than 140° C. may not result in adequate sintering of the particles in the sintering powder and/or may not result in adequate removal of the organics by evaporation and/or burn out. Temperatures higher than 350° C. may result in damage to the work pieces.

In a further aspect the present invention provides a method of manufacturing the sintering powder as described herein comprising the steps:
providing a metal salt solution;
contacting the metal salt solution with a capping agent; and
precipitating metal particles at least partially coated with the capping agent.

The precipitated metal particles may be recovered from the solvent, for example by filtering. An example of the metal salt solution is a metal nitrate solution.

The precipitating step may be carried out using a reducing agent. Reducing agents are particularly effective at causing precipitation of the metal particles. Particularly suitable reducing agents include, for example, hydrazine (e.g. hydrazine hydrate) and sodium borohydride.

Excess of the capping agent may be washed off using a polar solvent such as, for example, methanol or acetone.

As will be appreciated, the method, powder, paste and film disclosed herein are associated with a number of benefits over prior art techniques. In particular, there is no slump phenomena, no bridges, no bubbles in print deposit, no bleed-out and no aperture blocking when printing with the paste. Moreover, it is possible to provide a paste height of from 80-90 micrometers with flat deposits, no Dog-ears and no undulations. Thus, the benefits of the paste which includes a binder (e.g. resin) include:
Pressure-less Sintering
Process ability in standard SMT Line
Flat and uniform surface topology
Die Shear Strength average>20 MPa
No interfacial failure mode
Room Temp Stability=min 1 month
Thermal Cycling: Acceptable joint strength up to 1500 cycles (−40 C to +125 C, 10 min dwell).
Needle and Jet Dispensable
Film Form Factor In addition to the benefits mentioned above, the paste containing organosilver compound has some further benefits which are listed below:
High die shear strength (25 to 45 MPa)
High thermal conductivity (>200 W/mK)
Pin transferable
Good high thermal properties The invention will now be described with reference to the following non-limiting Figures, in which:

FIG. 1 shows (a) Large area Ag films (Example 1) prepared using tape caster and inset shows a rectangular piece of the film on PET, (b) optical microscopic image of the free standing dry film of 18-20 20 μm thickness, (c-e) optical microscopic images of free standing dry film of Example 2 on PET (30-40 μm thickness) and (f-g) optical microscopic images of free standing dry film of Example 5 on PET.

Figure 7:
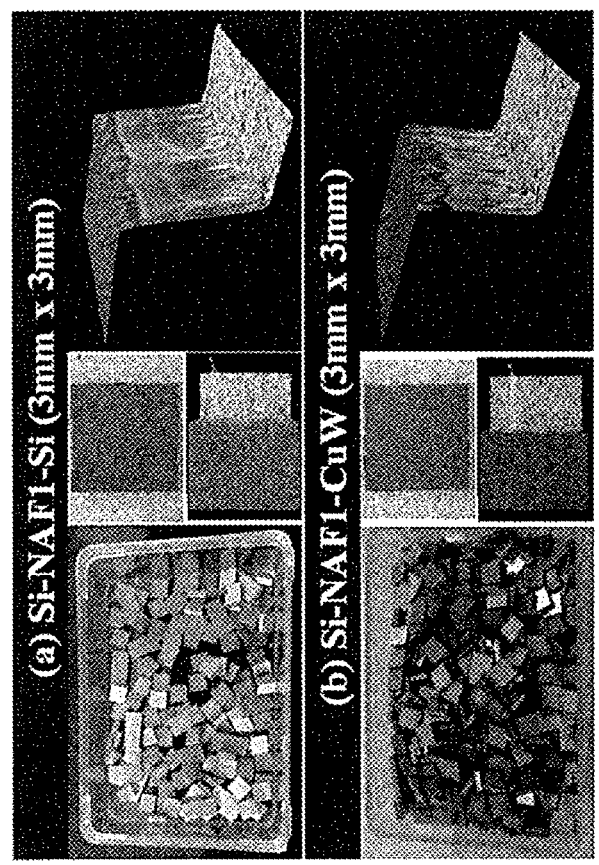

FIG. 7 shows images of diced (3 mm×3 mm) samples from thermo-compression bonded (a) Ni/Au coated 4" Si wafer pairs and (b) Ni/Au coated 4" Si wafer with Ni/Au coated 4" CuW wafer using 18-20 μm film of Example 2 prepared by commercially available dicing machine. No chipping is observed.

Figure 8:
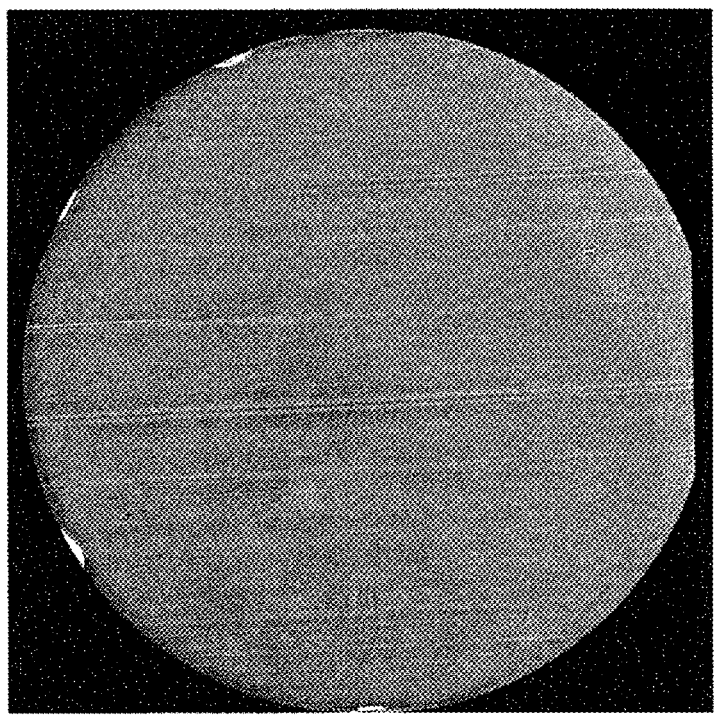

FIG. 8 shows a C-SAM image of thermo-compression bonded Ni/Au coated 4" Si wafer pairs using 18-20 μm film of Example 1.

Figure 9:
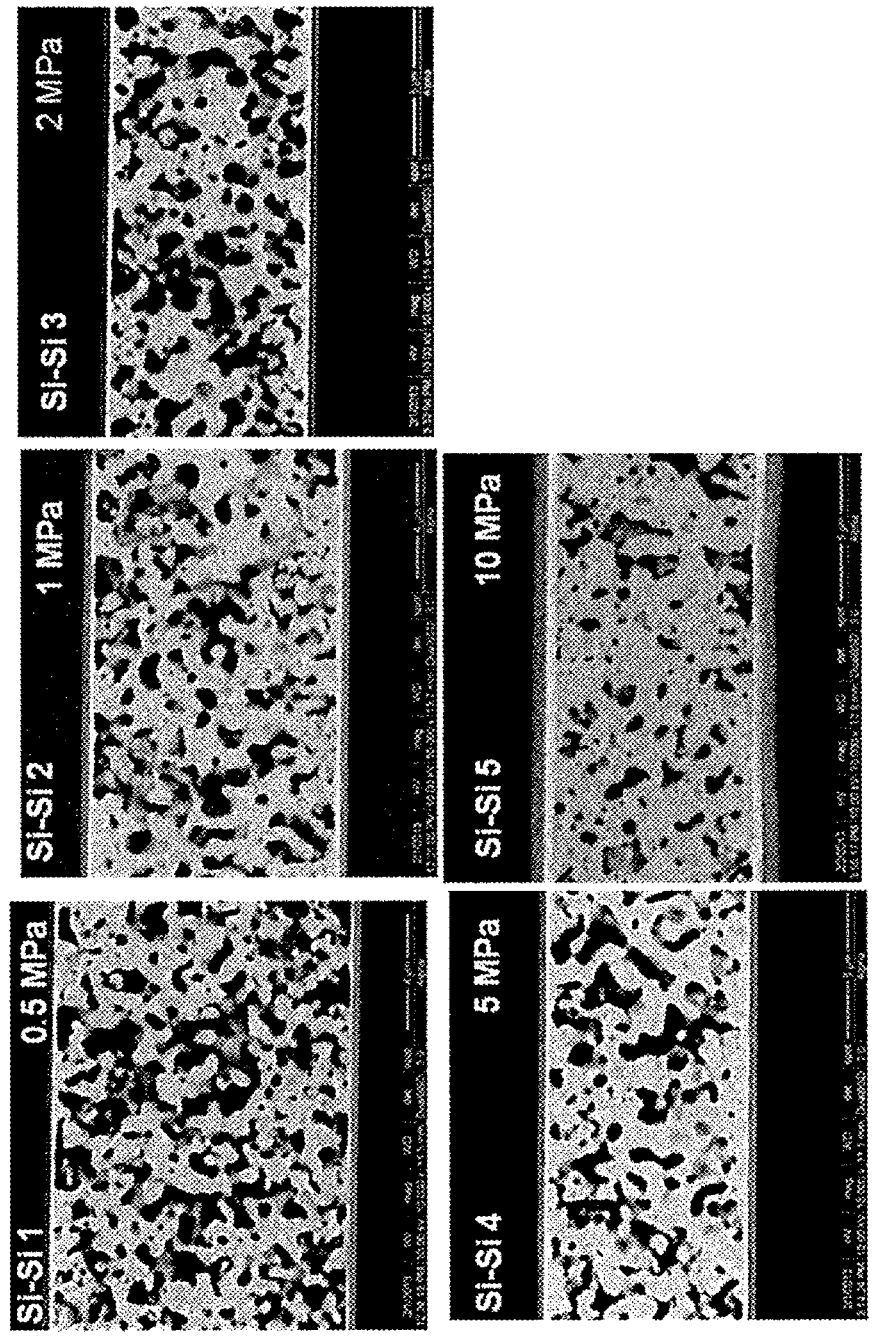

FIG. 9 shows SEM images of the cross-section area of diced samples revealing ELT and microstructures. These samples were prepared from thermo-compression bonded Ni/Au coated Si wafer pairs using 18-20 μm film of Example 1 at different applied pressures: 0.5 (top left), 1 (top centre), 2 (top right), 5 (bottom left) and 10 MPa (bottom centre).

Figure 10:
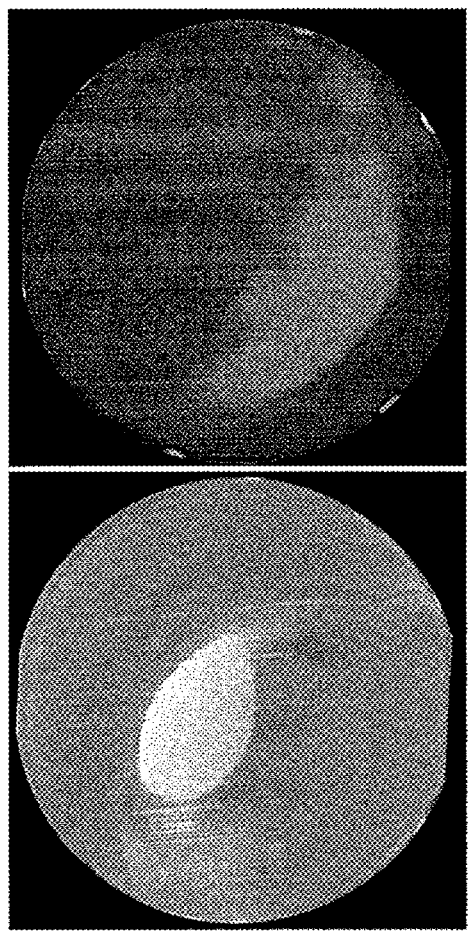

FIG. 10 shows C-SAM images of thermo-compression bonded Ni/Au coated 4" Si wafer pairs using 18-20 μm film of Example 1 without post heating step (step 4).

Figure 11:
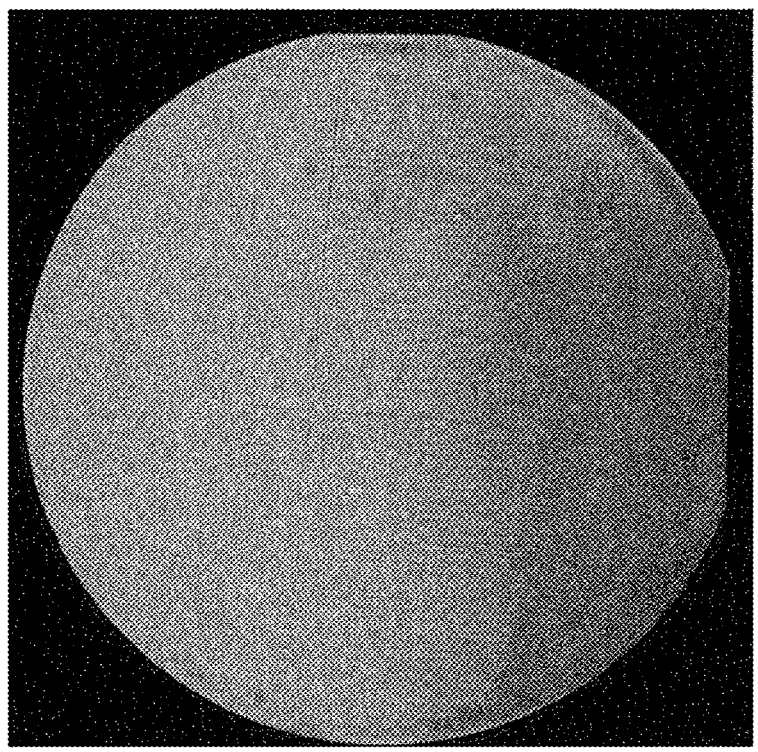

FIG. 11 shows representative CSAM image of thermo-compression bonded Ni/Au coated 4" Si wafer with Ni/Au coated 4" CuW wafer using 18-20 μm film of Example 1.

Figure 12:
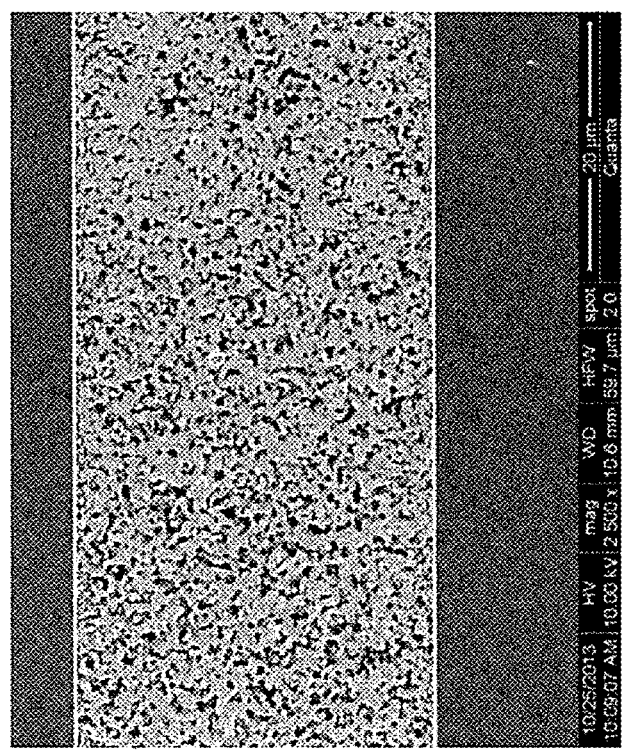

FIG. 12 shows an SEM image of the cross-sectional area of the ion-polished dies prepared from thermo-compression bonded Ni/Au coated 4" Si wafers using 30-40 μm film of Example 2.

Figure 13:
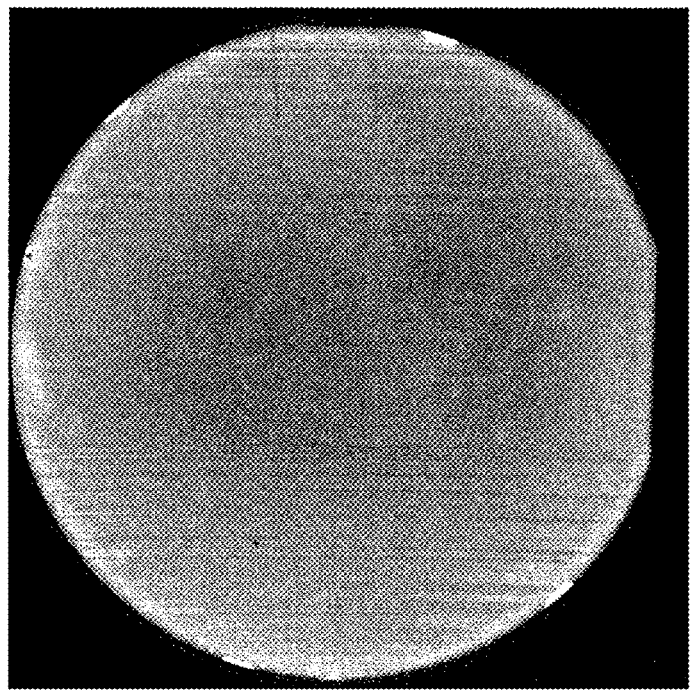

FIG. 13 shows a C-SAM image of thermo-compression bonded Ni/Au coated 4" Si wafer with Ni/Au coated 4" CuW wafer using film of Example 2. The C-SAM image confirms good bonding and there is no delamination or void in the bonded wafers.

Figure 14:
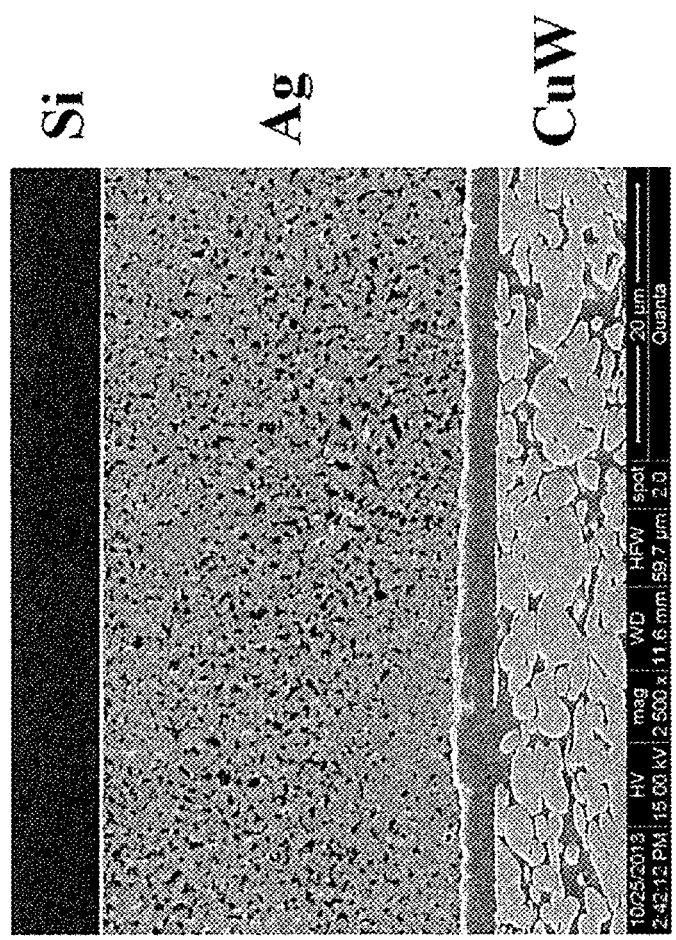

FIG. 14 shows an SEM image of the cross-sectional area of the ion-polished dies prepared from thermo-compression bonded 4" Si wafer with Ni/Au coated 4" CuW wafer using 30-40 μm film of Example 2.

Figure 15:
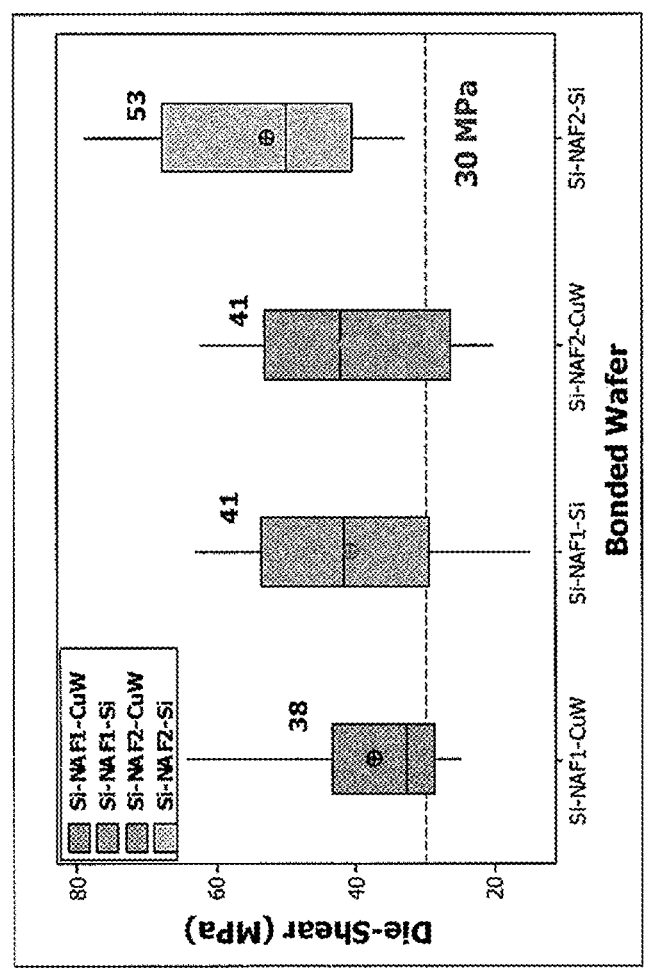

FIG. 15 shows a plot of die-shear of 3 mm×3 mm sized dies prepared from thermo-compression bonded Ni/Au coated 4" Si wafers pairs and Ni/Au coated 4" Si wafer with Ni/Au coated 4" CuW using film of Example 1 and film of Example 2.

The invention will now be described with reference to the following non-limiting Examples.

Example 1

0 to 8% resin or polymer, 0 to 2% film forming agent and 5 to 30% solvent mixture were mixed to get a homogeneous solution. To this mixture, 0 to 2% wetting agents, 0 to 2% organic peroxides were added, followed by the addition of 65 to 85% of the aforementioned silver nanopowder (i.e. having a mean longest dimension of from 5 to 75 nm) and was mixed using an orbital mixer at 1000 rpm. After mixing, the mixture was milled in a three roll mill for few minutes to obtain a homogenous paste.

Example 2

0 to 2% film forming agent, 0 to 5% silver metallo organic compound (Ag MOC), 5 to 30% solvent mixture were mixed in a jar. To this mixture, 0 to 2% wetting agents, 0 to 2% organic peroxides were added, followed by the addition of 65 to 85% of the aforementioned silver nanopowder (i.e. having a mean longest dimension of from 5 to 75 nm). This mixture was mixed using an orbital mixer at 1000 rpm. After mixing, the mixture was milled in a three roll mill for a few minutes to obtain a homogenous paste.

Example 3

0 to 2% film forming agent, 0 to 8% resin or polymer, 0 to 5% silver metallo organic compounds (Ag MOC) and 5 to 30% solvent mixture were mixed in a jar. To this mixture, 0 to 2% wetting agents, 0 to 2% organic peroxides were added, followed by the addition of 65-85% of the aforementioned silver nanopowder (i.e. having a mean longest dimension of from 5 to 75 nm). This mixture was mixed using an orbital mixer at 1000 rpm. After mixing, the mixture was milled in a three roll mill for a few minutes to obtain a homogenous paste.

Example 4

0 to 2% film forming agent, 0 to 8% resin or polymer, 0 to 7% silver metallo organic compounds (Ag MOC) and 5 to 30% solvent mixture were mixed in a jar. To this mixture, 0 to 2% wetting agents, 0 to 2% organic peroxides were added, followed by the addition of 65 to 95% of silver micron particles (i.e. having a mean longest dimension of from 100 nm to 50 μm). This mixture was mixed using an orbital mixer at 1000 rpm. After mixing, the mixture was milled in a three roll mill for a few minutes.

Example 5

0 to 2% film forming agent, 0 to 8% resin or polymer, 0 to 7% silver metallo organic compounds (Ag MOC) and 5 to 30% solvent mixture were mixed in a jar. To this mixture, 0 to 2% wetting agents, 0 to 2% organic peroxides were added, followed by the addition of 65-95% of a mixture of silver nano (i.e. having a mean longest dimension of from 5 to 75 nm) and micron particles (i.e. having a mean longest dimension of from 100 nm to 50 μm). This mixture was mixed using an orbital mixer at 1000 rpm. After mixing, the mixture was milled in a three roll mill for a few minutes.

Thermal conductivity of the sintered silver samples of Examples 1-5 are found to be in the range of 100-250 $W \cdot m^{-1} \cdot K^{-1}$. Thermal conductivity of the sintered silver samples are prepared by heating the paste in Examples 1-5 at 250° C. for 60 min with no applied pressure and are measured using a Netzsch LFA 447 Nanoflash. Thermal conductivity k ($W \cdot m^{-1} \cdot K^{-1}$) was calculated using the following formula: $K = \alpha \, \rho \, c_p$, where, $\alpha$ is thermal diffusivity ($m^2 \cdot s^{-1}$), $\rho$ is the density of the material ($Kg \cdot m^{-3}$) and $c_p$ is the specific heat capacity ($J \cdot kg^{-1} \cdot K^{-1}$).

Film Preparation Process:

Films were prepared by printing on silicon coated polyester sheet either using a commercially available tape caster in roll to roll fashion, using a micro gauge controlled doctors blade assembly supplied with the tape caster or by manual stencil printing using a doctor blade.

Figure 1:
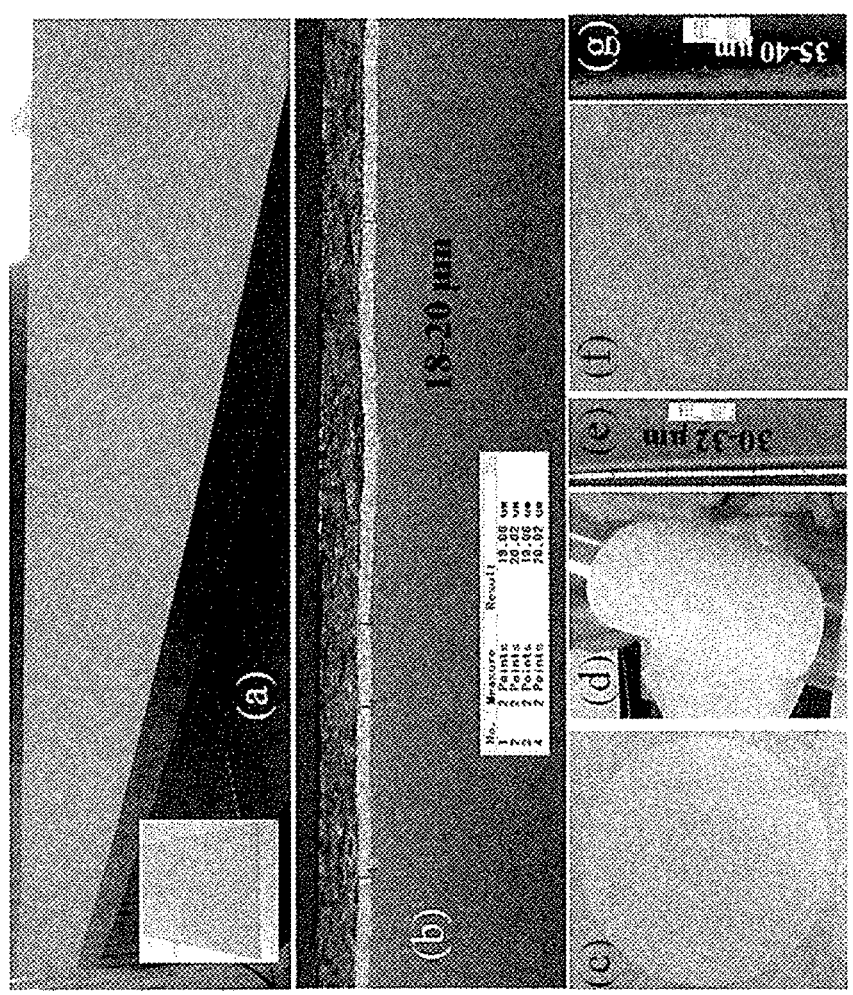

Commercially Available Tape Caster:

The paste of Example 1 was printed on a silicon coated polyester sheet using a commercially available tape caster and was dried at 130° C. on its heated surface in roll to roll fashion. For complete drying, the film takes 10 to 15 minutes. The thickness of the film was controlled using the gap setting of the doctor blade assembly supplied with the tape caster. Film thicknesses of 18-20 μm and 33-35 μm were prepared by changing the gap setting of the micro gauge controlled doctor blade assembly. FIG. 1 (*a*) shows the large area film prepared using tape caster and inset shows a rectangular piece of the film on PET. FIG. 1 (*b*) shows the optical microscopic image of the free standing dry film of 18-20 20 μm thickness. Films having thickness>5 μm can also be easily obtained by simply changing the gap setting of the doctor blade assembly.

Manual Stencil Printing:

The paste of Example 2 was manually stencil printed using a doctor blade on silicon coated polyester. These as prepared films were dried at 60-90° C. in an oven for 30-90 minutes. The thickness of such manually printed films of Example 2 is found to be 20-60 μm. Optical microscopic images of free standing dry film of Example 2 and Example 5 on PET (30-40 μm thickness) are shown in FIG. 1 (*c-e*) and FIG. 1 (*f-g*) respectively. Alternatively, films also can be printed on silicon coated polyester sheet using a commercially available tape caster in roll to roll fashion and thickness of the film can be controlled using the gap setting of the micro gauge controlled doctor blade assembly supplied with the tape caster.

Figure 2:
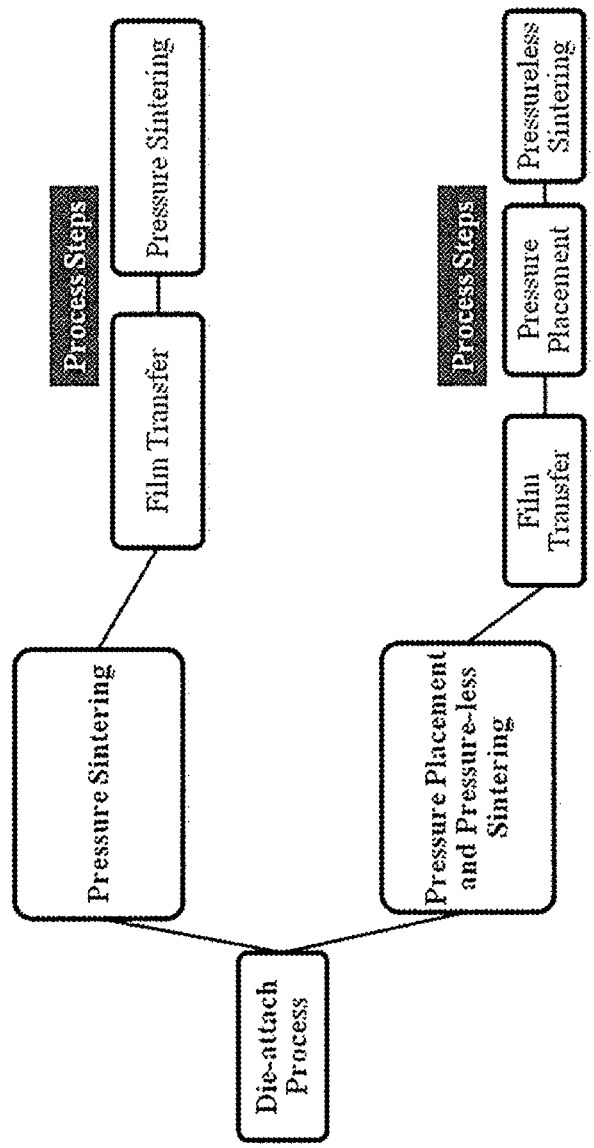
FIG. 2 shows a schematic representation of die-attach processes "Pressure Sintering (PS)" Vs. "Pressure Placement and Pressure-less Sintering (PPPS)" process steps for die-attach application of the sintering film of the present invention.

Application of Ag Films for Die-Attachment:

The sintering films of the present invention can be used for the joining of electronic components using variety of silver sintering based existing die-attached processes (Pressure Sintering (PS) Process) including those as described in patent application U.S. Ser. No. 13/287,820, the disclosure of which is hereby incorporated by reference. In addition, the sintering films of the present invention can be used in a die attach "Pressure Placement and Pressure-less Sintering (PPPS) process". FIG. 2 shows the schematic representation of the general process steps of "Pressure Sintering (PS)" Vs. "Pressure Placement and Pressure-less Sintering (PPPS)" process steps using the sintering films of the present invention. There are several additional advantages for this new PPPS process as compared to PS process viz., shorter time required for die-placement (high UPH), low-pressure requirement for placement (highly advantageous for processing thin wafers), compatibility with commercial die-bonder and sintering in external heating equipment (batch process to improve UPH). Additionally, these sinterable Ag films can also be used for PS process that require significantly higher pressure (>5 MPa) during sintering based die-attached processes.

Figure 3:
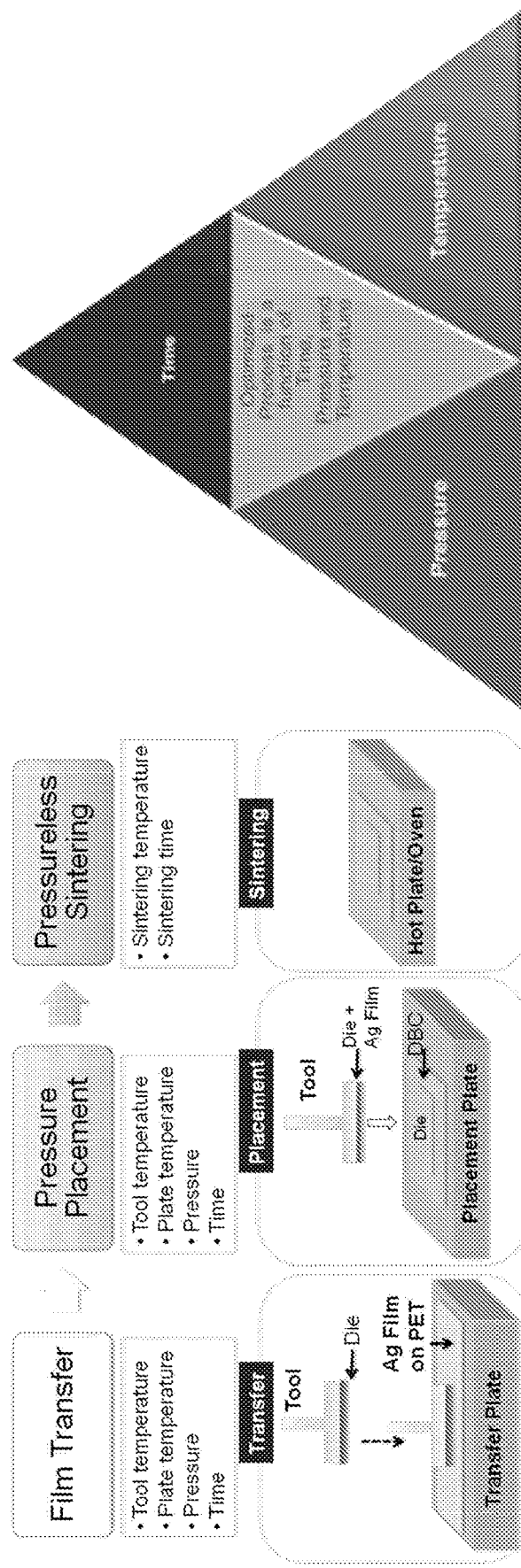
FIG. 3 shows a schematic representation of "Pressure Placement and Pressure-less Sintering" process steps for die-attach application of the sintering film of the present invention and its typical process parameters and their interdependencies.

Pressure Placement and Pressure-Less Sintering (PPPS) Process:

The sintering films of the present invention can be used for the joining of electronic components using a new silver sintering low-temperature and low-pressure die-attach process "Pressure Placement and Pressure-less Sintering (PPPS) process". FIG. 3 shows the schematic representation of "Pressure Placement and Pressure-less Sintering process" steps for die-attach application of nano-Ag film, its typical process parameters and their interdependence. Joining of electronic components using this Pressure Placement and Pressure-less Sintering process using this sinterable Ag film is very versatile and the exact combination of time, temperature and pressure can be optimized based on the nature of application and thermo-mechanical, electrical and thermal performance requirements.

PPPS Die-Attach Process Steps:

The overall bonding process may typically include, for example: 1) Film transfer, 2) Pressure Assisted Die Placement and 3) Pressureless Sintering, unless stated otherwise separately elsewhere.

(1) Film Transfer: Sinterable Ag film transfer on the die by stamping process using optimized combination of time, pressure and temperature of tool and plate. Typical process parameters are:

Tool Temperature: Room Temperature to 400° C.
Plate Temperature: Room Temperature to 400° C.
Pressure: 0.1 to 5 MPa
Time: 0.1 to 60 s (2) Pressure Assisted Die Placement: Placement of sinterable Ag containing die on DBC (direct bonded copper) substrate using optimized combination of time, pressure and temperature of tool and plate. Typical process parameters are:

Tool Temperature: Room Temperature to 400° C.
Plate Temperature: Room Temperature to 400° C.
Pressure: 0.1 to 40 MPa
Time: 0.1 to 60 min
Additional Heating Time: May include additional 0-60 min immediately after placement (without applying any external pressure)

(c) Pressureless Sintering: Pressureless sintering is carried out in an external oven or hot plate. Process parameters are summarized below:

Sintering Temperature: 150-400° C.
Sintering Time: 0 to 120 min

Pressure Assisted Sintering (PS) Process:

The sintering films described herein can be used for the joining of electronic components using pressure assisted sintering die-attach process. Joining of electronic components using this pressure assisted sintering process using this sinterable Ag film is very versatile and the exact combination of time, temperature and pressure can be optimized based on the nature of application and thermo-mechanical, electrical and thermal performance requirement.

PS Die-Attach Process Steps:

The overall bonding process may typically include, for example: 1) Film transfer, 2) Pressure Assisted Die Placement and Sintering, unless stated otherwise separately elsewhere.

(1) Film Transfer: Sinterable Ag film transfer on the die by stamping process using optimized combination of time, pressure and temperature of tool and plate. Typical process parameters are:

Tool Temperature: Room Temperature to 400° C.
Plate Temperature: Room Temperature to 400° C.
Pressure: 0.1 to 5 MPa
Time: 0.1 to 60 s (2) Pressure Assisted Die Placement and Sintering: Placement of sinterable Ag containing die on DBC substrate using optimized combination of time, pressure and temperature of tool and plate. Typical process parameters are:

Tool Temperature: Room Temperature to 400° C.
Plate Temperature: Room Temperature to 400° C.
Pressure: 0.1 to 40 MPa
Time: 0.1 s to 60 minutes
Additional Heating Time: May include additional 0-60 min immediately after placement (without applying any external pressure)

General Characterization Processes of Bonded Dies:

The bonded dies were characterized with die-shear, thermal shock and cycling, bond-layer thickness measurements and microstructure analysis, using SEM after ion-polishing.

Figure 4:
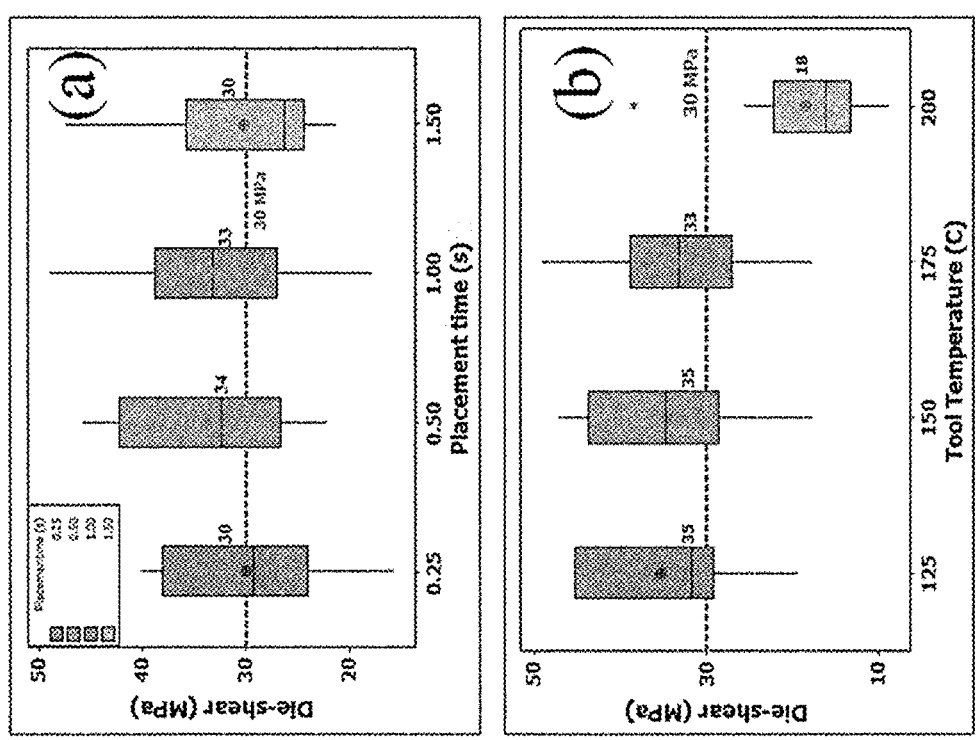
FIG. 4 shows plots of die-shear of 3 mm×3 mm Ni/Au coated Si dies attached on Ni/Ag coated DBC using the film of Example 2 as a function of a) placement time and b) tool temperature using "Pressure Placement and Pressure-less Sintering Die-attach Process".
Figure 5:
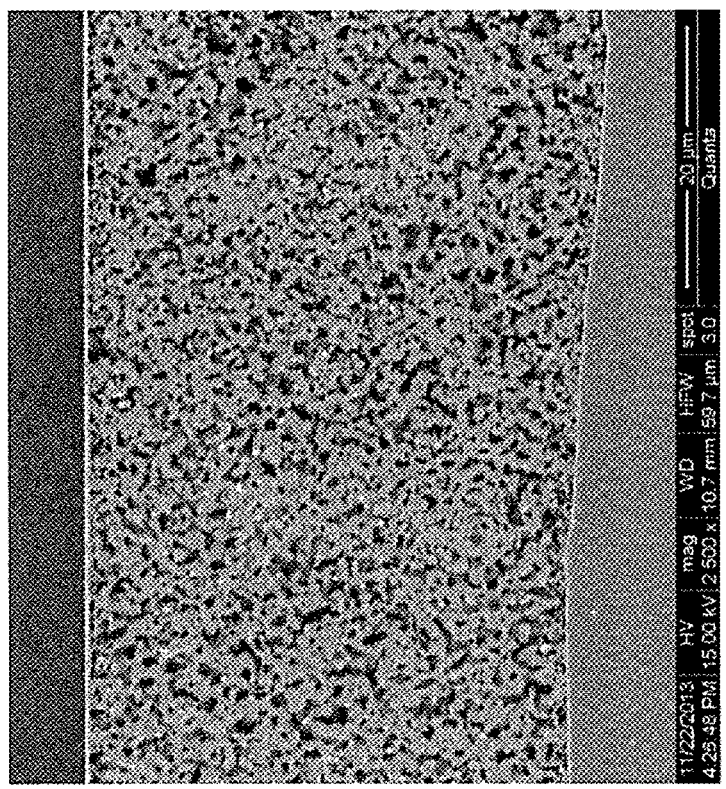
FIG. 5 shows SEM images of the cross-section area of 3 mm×3 mm Ni/Au coated Si dies attached on Ni/Ag coated DBC using the film of Example 2 at placement time is using "Pressure Placement and Pressure-less Sintering Die-attach Process".

Die-Attach Application 1 (PPPS):

The application of the sintering film formed of Example 2 has been demonstrated for the joining of electronic components using a pressure sintering process (Process schematic is shown in FIG. 3). An example of such application has been demonstrated attaching Ni/Au coated 3 mm×3 mm Si dies on Au or Ag coated DBC substrates using sinterable Ag film using a laboratory manual die-bonder. FIG. 4 shows die-shear results of 3 mm×3 mm Ni/Au coated Si dies attached on Ni/Ag coated DBC using the sintering film formed of Example 22 as a function of a) placement time and b) tool temperature using "Pressure Placement and Pressure-less Sintering Die-attach Process". Following process parameters are used for die-attach:

(1) Film Transfer:
Tool Temperature: 100-200° C.
Plate Temperature: Room Temperature
Pressure: 1.5 MPa
Time: 1 s (2) Pressure Assisted Die Placement:
Tool Temperature: 100-200° C.
Plate Temperature: 200° C.
Pressure: 2
Time: 0.25 to 1.5 s
Additional Heating Time: None (3) Pressureless Sintering:
Sintering Temperature: 225° C.
Sintering Time: 60 min FIG. 5 shows the SEM images of the cross-sectional area of the ion-polished dies prepared from 3 mm×3 mm Ni/Au coated Si dies attached on Ni/Ag coated DBC using sintering film formed of Example 2 with 1 s placement time. The SEM of the bonding layer shows the necking of the sintered silver particles with a good packing fraction.

Die-Attach Application 2 (PS):

The application of the sintering film formed of Example 5 has been demonstrated for the joining of electronic components using a pressure assisted sintering process. An example of such application has been demonstrated attaching Ni/Au coated 3 mm×3 mm Si dies on Au or Ag coated DBC or Ag coated Cu lead frames substrates the sintering film formed of Example 5 using a laboratory manual die-bonder by applying sintering pressure 5-20 MPa at 250° C. for 30-90 s sintering time. The die-shear results show strong bonding (>40 MPa) and the SEM of the bonding layer shows the necking of the sintered silver particles with a good packing fraction.

Application of Ag Films for Wafer Bonding:

Thermo-compression bonding applications of a pair of Ni/Au coated 4" Si wafers (Si-Sintered Ag—Si) and Ni/Au coated 4" Si wafer with Ni/Au coated 4" CuW wafer (Si-Sintered Ag—CuW) are demonstrated using a film formed of Example 1 and a film formed of Example 2 at 250° C. using 1 MPa pressure using a laboratory press. For all of the demonstration of the wafer bonding (application 1-4) using these films, the following bonding processes are followed unless stated otherwise elsewhere.

Wafer Bonding Process Steps:

The overall bonding process may typically include, for example: 1) Film transfer, 2) Wafer stack formation, 3) Wafer bonding and 4) Post heating, unless stated otherwise separately elsewhere.

Figure 6:
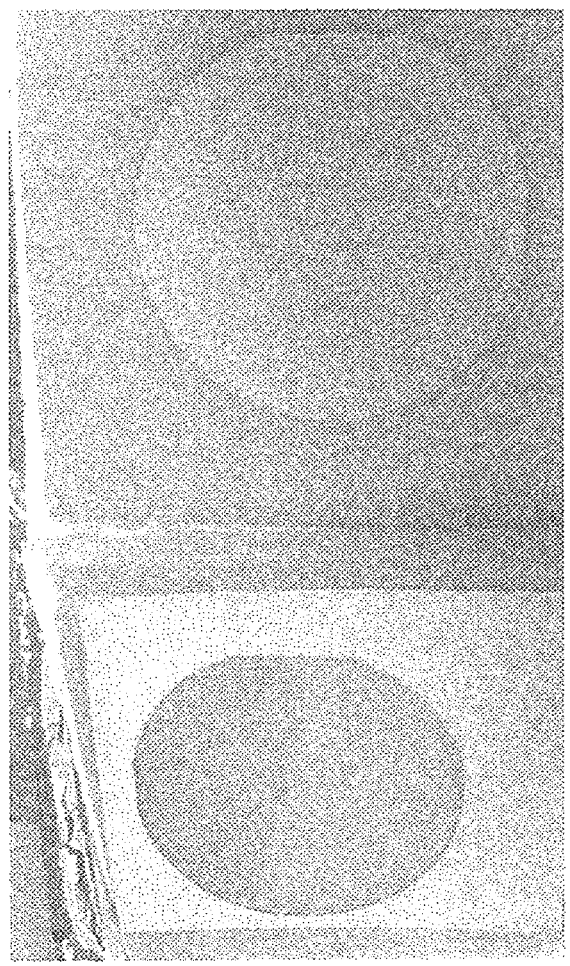
FIG. 6 shows transferred Ag film on Ni/Au coated Si wafer and remaining film on PET after transfer.

1) Film Transfer:

The Ag film is transferred from PET surface to either Ni/Au coated Si or Ni/Au coated CuW at 80-150° C. and 1 MPa pressure for 5 min. The remaining Ag film and PET were removed and Ag transferred Ni/Au coated Si or Ni/Au coated CuW wafers were used for stack formation. FIG. 6 shows the images of transferred Ag film on Ni/Au coated Si wafer and remaining film on PET after transfer.

2) Wafer Stack Formation:

Stack is prepared by placing a Ni/Au coated Si wafer on Ag film transferred Ni/Au coated Si or Ni/Au coated CuW by step 1. The stack is then heated at 100-150° C. and 1 MPa pressure for 5-15 min.

3) Wafer Bonding

Wafers stack processed by step 2 is used for bonding at 250° C. and 1 MPa pressure for 15 min.

4) Post Heating

Wafers stack processed at 250 by step 3 are used for post heating at 250° C. without any applied pressure for 45 min. After these processes, bonded wafer is cooled to room temperature and used for further characterization.

General Characterization Processes of Bonded Wafers:

All of the bonded wafers were inspected for delamination and voids using C-SAM. These bonded wafers were then diced to obtain different die sizes, like, 3 mm×3 mm & 10 mm×10 mm for various characterizations, such as die-shear, thermal shock and cycling, bond-layer thickness measurements and microstructure analysis, using SEM after ion-polishing. For example, FIG. 7 shows the images of diced (3 mm×3 mm) samples using commercially available dicing machine prepared from thermo-compression bonded (a) Ni/Au coated 4" Si wafer pairs and (b) Ni/Au coated 4" Si wafer with Ni/Au coated 4" CuW wafer, using 18-20 μm film of Example 1. No de-bonding and chipping are observed for all of these bonded wafers, indicating good bonding.

Wafer Bonding Application 1 (Si-AF1-Si)

Bonding at Different Applied Pressure:

Thermo-compression bonding of a pair of Ni/Au coated 4" Si wafers are demonstrated using 18-20 μm film of Example 1 at 250° C. using 0.5, 1, 2 and 5 MPa pressure using a laboratory press. For 10 MPa pressure a pair of Ni/Au coated 2" Si wafers were used. All of the bonded wafers were inspected for delamination and voids using C-SAM and confirmed there is no-delamination and voids. FIG. 8 shows the C-SAM image of thermo-compression bonded Ni/Au coated 4" Si wafer pairs using 18-20 μm film of Example 1. The C-SAM image confirms good bonding and there is no delamination and voids in the bonded wafers.

These bonded wafers were then diced to different die sizes, like, 3 mm×3 mm, 10 mm×10 mm and used for determining die-shear, bond-layer thickness measurement and microstructure analysis using SEM after ion-polishing. To investigate the effect of the pressure on the microstructure and bond line thickness (BLT) of the sintered silver layers, these wafers were diced and investigated using SEM. FIG. 9 shows the SEM images of the cross-sectional area of the ion-polished dies prepared from thermo-compression bonded pairs Ni/Au coated Si wafers using 18-20 µm film of Example 1 at different applied pressures: a) 0.5, b) 1, c) 2, d) 5 and e) 10 MPa. The SEM of the bonding layer shows the necking of the sintered silver particles with a good packing fraction. The BLT is found highly pressure dependent at the low pressure region (0.5 to 2 MPa), after which the effect of pressure on BLT becomes less prominent. In contrast, the microstructure of these sintered silver are highly pressure dependent throughout the experimentally applied pressure range as evident from the crystallite size, interlinking neighbors and density. As can be seen, at pressures of 5 and 10 MPa, it produces a highly dense and interlinked structure. The die-shear of the bonded dies show bulk or interfacial failure and thus it can be concluded that the sintered silver bonding materials is very strong as compared to the bonded silicon wafer materials.

Bonding without Post Heating:

To confirm the necessity of the post heating step, we have bonded two pairs of Ni/Au coated 4" Si wafers using the 18-20 µm film formed of Example 1 at 250° C. using 1 MPa pressure using a laboratory press, without performing post heating step (step 4). As it can be clearly seen in FIG. 10, there are several delaminating areas present in these wafers.

Wafer Bonding Application 2 (Si-AF1-CuW):

Thermo-compression bonding of Ni/Au coated 4" Si wafer with Ni/Au coated 4" CuW wafer are demonstrated using 18-20 µm film formed of Example 1 at 250° C. using 1 MPa pressure using a laboratory press. FIG. 11 shows the C-SAM image of thermo-compression bonded Ni/Au coated 4" Si wafer with Ni/Au coated 4" CuW wafer using 18-20 µm film of Example 1. The C-SAM image confirms good bonding and there is no delamination and voids in the bonded wafers. These bonded wafers were then diced to different die sizes like, 3 mm×3 mm & 10 mm×10 mm and used for determining die-shear, bond-layer thickness measurement and microstructure analysis, using SEM after ion-polishing. To investigate the effect of film thickness on the bond line thickness (ELT) of the sintered silver layers, we have chosen 18-20 and 32-35 µm films formed of Example 1 to bond 4" Si wafer with Ni/Au coated 4" CuW wafer at 250° C. using 1 MPa pressure using a laboratory press. The SEM of the bonding layer shows the necking of the sintered silver particles with a good packing fraction. The BLT is found to be decreased with decreasing the film thickness. The die-shear of the bonded dies shows bulk or interfacial failure and thus it can be concluded that the sintered silver bonding materials is very strong as compared to the bonded silicon wafer materials.

Wafer Bonding Application 3 (Si-AF2-Si):

Thermo-compression bonding of a pair of Ni/Au coated 4" Si wafers are demonstrated using 30-40 µm film of Example 2 at 250° C. using 1 MPa pressure using a laboratory press. All of the bonded wafers were inspected for delamination and voids using C-SAM and confirmed there is no-delamination and voids. C-SAM images of thermo-compression bonded Ni/Au coated 4" Si wafer pairs using 30-40 µm film of Example 2 confirms good bonding and there is no delamination and voids in the bonded wafers. These bonded wafers were then diced to different die sizes, like, 3 mm×3 mm, 10 mm×10 mm and utilized for die-shear, and bond-layer thickness measurements and microstructure analysis, using SEM after ion-polishing. FIG. 12 shows the SEM images of the cross-sectional area of the ion-polished dies prepared from thermo-compression bonded pairs Ni/Au coated 4" Si wafers using 30-40 µm film of Example 2 at 1 MPa applied pressure. The SEM of the bonding layer shows the necking of the sintered silver particles with a good packing fraction. The die-shear of the bonded dies show bulk or interfacial failure and thus it can be concluded that the sintered silver bonding materials is very strong as compared to the bonded silicon wafer materials.

Wafer Bonding Application 4 (Si-AF2-CuW):

Thermo-compression bonding of Ni/Au coated 4" Si wafer with Ni/Au coated 4" CuW wafer are demonstrated using 30-40 µm film of Example 2 at 250° C. using 1 MPa pressure using a laboratory press. FIG. 13 shows the C-SAM image of thermo-compression bonded Ni/Au coated 4" Si wafer with Ni/Au coated 4" CuW wafer with 30-40 µm film of Example 2. The C-SAM image confirms good bonding and there is no delamination and void in the bonded wafers. These bonded wafers were then diced to different die sizes like, 3 mm×3 mm & 10 mm×10 mm and utilized for die-shear and bond-layer thickness measurements and microstructure analysis using SEM after ion-polishing. FIG. 14 shows the SEM images of the cross-sectional area of the ion-polished dies prepared from thermo-compression bonded 4" Si wafer with Ni/Au coated 4" CuW wafer using 30-40 µm film of Example 2 at 250° C. using 1 MPa pressure. The SEM of the bonding layer shows the necking of the sintered silver particles with a good packing fraction. The die-shear, of the bonded dies, shows bulk or interfacial failure and thus, it can be concluded that the sintered silver bonding materials is very strong as compared to the bonded silicon wafer materials.

Mechanical and Thermo-Mechanical Characterization of Bonded Wafers

Die-Shear Results:

To investigate the mechanical bond strength of bonding sintered Ag layer, the thermo-compression bonded wafers were diced into 3 mm×3 mm sized die and die-shear test performed. The die-shear of the bonded dies show bulk or interfacial failure and thus it can be concluded that the sintered silver bonding materials is very strong as compare to the bonded silicon wafer materials. FIG. 15 shows comparison of the die-shear values of 3 mm×3 mm sized dies prepared from thermo-compression bonded pair of Ni/Au coated 4" Si wafers and Ni/Au coated 4" Si wafer with Ni/Au coated 4" CuW wafer using a film formed of Example 1 and a film formed of Example 2 at 250° C. using 1 MPa pressure.

Thermal Shock Results:

To investigate the effect of thermal stress on the bonded wafer and dies using sintered nano-sliver films, the thermo-compression bonded 4" Si wafer with Ni/Au coated 4" CuW wafer using a film formed of Example 1 and a film formed of Example 2 at 250° C. and 1 MPa pressure and 10 mm×10 mm dies were subjected to thermal shock experiments following the JESD22-A104-B Test Condition B, Soak Mode 2 (−55 to +125° C., 5 mins dwell time, 1000 cycles). The C-SAM images of both the bonded wafers and dies post 1000 cycles do not reveal any delamination, voids and cracks in the bonded wafers.

Thermal Cycling Results:

To investigate the effect of thermal stress on the bonded dies using sintered nano-sliver films, 10 mm×10 mm diced samples from the thermo-compression bonded 4" Si wafer with Ni/Au coated 4" CuW wafer using film formed of Example 1 and film formed of Example 2 at 250° C. and 1 MPa pressure were subjected to thermal cycling experiments following the IPC 9701-A Standard TC3/NTC-C Profile (−40 to +125° C., 15 mins dwell time, 1000 cycles). The C-SAM images of these dies post 1000 cycles do not reveal any delamination, voids and cracks in the bonded wafers.

Other applications of the sintering powders, sintering films and sintering pastes of the present invention are as follows:

1. Wafer-to-wafer bonding layers for Vertical LED Designs, Thin Film Flip Chip Designs and Red LED Designs, based on both printable pastes and films. There is a significant need for wafer-to-wafer bonding at low temperatures (under 250° C. and also under 200° C.) where the bonding layer exhibits very high temperature properties post bonding. In the case of LED wafer bonding, this can be accomplished for example, in the context of either thin film flip chip or vertical thin film or truncated inverted pyramid LEDs, where CTE mismatch and therefore strain and defect generation can be minimized, while allowing for high temperature post processing with a variety of advanced materials for enhancing light output and electrical efficiency of the device. Further, the high temperature and high thermal and electrical conductivities of the bonding layer allow for superior thermal transfer, high temperature operation of the device and superior current spreading, among other advantages. Such wafer bonding can be accomplished by lamination of films of the said material on the backside of the wafers, followed by temperature and pressure processing in a standard wafer bonder or a press. Another means of doing the processing includes printing a conformal layer of paste on the wafer backside, followed by drying and bonding in a standard wafer bonder or press, under temperature and pressure conditions. Other applications for such wafer bonding include power semiconductor wafers, Through Silicon Via (TSV) applications, stacked die applications, MEMS, concentrated photovoltaic and other applications. Low temperature sintering enables assembly of high CTE mismatch stacks as well as temperature sensitive material stacks, thermoelectric materials and piezoelectric materials.

2. Attachment of semiconductor die (either flip chip or wire bonded), onto a variety of substrates such as DBC (Direct Bond Copper), DPC (Direct Plate Copper), MCPCB (Metal Core PCBs), FR4, Copper lead-frames, Flexible PCBs and substrates, Copper and Aluminum Heat-Sinks, Fixtures, etc.). Applications include LED die (light emitting diodes for example of the lateral, vertical thin film or flip chip varieties) made from various compound semiconductor materials, power die made from silicon, concentrated photovoltaic compound semiconductor cells (e.g. multi-junction cells) silicon carbide and gallium nitride used in power modules, and discrete devices, MEMS (microelectromechanical sensor) devices of all types, semiconductor and stacked die and other applications such as thermoelectric materials and piezoelectric materials.

(a) The attachment of such semiconductor or other die elements can be accomplished by printing on to the substrates, followed by die placement via a die bonder or a pick and place machine, and sintering in either a reflow oven belt or box oven. Attachment of such semiconductor and die elements can also be accomplished via dispensing the paste, followed by die placement and sintering as outlined above, or doing film transfer and lamination on the die backside of the film made from the said material, followed by die placement and tacking onto the substrate, followed by sintering. Flip chip die can be assembled by printing bumps on the substrate, placing the die, followed by sintering. Low temperature sintering enables assembly of high CTE mismatch stacks as well as temperature sensitive material stacks.

3. Attachment of semiconductor packages of various types (for example bottom termination components such as LGAs, QFNs, QFPs, etc.), onto a variety of substrates such as DBC (Direct Bond Copper), DPC (Direct Plate Copper), MCPCB (Metal Core PCBs), FR4, Flexible PCBs and substrates, Copper and Aluminum Heat-Sinks, Fixtures, etc.). Applications include LED packages of various types (for example, ceramic sub-mount LEDs, SMD LEDs with lead-frame construction, etc,) power modules, and discrete devices, MEMS (microelectromechanical sensor) packages of all types, semiconductor and stacked die packages and other applications.

(a) The attachment of such semiconductor or other packages can be accomplished by printing on to the substrates, followed by package placement via standard pick and place machine with Z Height adjustment and/or pressure capability, and sintering in either a reflow oven belt oven or box oven. Low temperature sintering enables assembly of high CTE mismatch stacks as well as temperature sensitive material stacks.

4. Production of interconnect lines ('circuitry, pads, etc.) separately and along with flip chip interconnects. For example, applications for interconnect lines include LED boards and luminaires, where the interconnect lines can be applied by a variety of printing (e.g. stencil printing) or dispensing or jetting techniques. In the case of LED applications, such interconnects can serve as both electrical and thermal conductors to carry the electrons to and from the device, and the heat away from the device. Further, such interconnect lines can be directly applied in the same step with interconnects for attaching flip chip or wire bonded devices. Another example of such interconnects is solar cells (either silicon based or thin film based), where the interconnects in a grid pattern could be used to collect electrons generated, and also connect one cell to another.

5. Reflective layer printing for LED and optical applications. The said material can be used to print reflective layers on to substrates such as DBC (Direct Bond Copper), DPC (Direct Plate Copper), MCPCB (Metal Core PCBs), FR4, Flexible PCBs and substrates, Copper and Aluminum Heat-Sinks, Fixtures, etc.), in order to provide light output enhancement and therefore luminous efficacy enhancement of LED and other optical systems. Such reflective layers can be formed via stencil or screen printing, jetting or dispensing or film lamination of the said material.

6. Hermetic and near hermetic sealing for packages, perimeter seals, etc. for LED, MEMS, OLED and PV applications and general semiconductor packaging. There is a significant need for hermetic sealing of LED, OLED, MEMS and thin film PV packages, to protect the devices from moisture ingress. The said material can exhibit hermetic or near hermetic sealing behavior with proper application and sintering. The said material can be applied in various stages of the manufacturing processes for the above devices: Either at the wafer level with wafer bonding, or in the packaging process via film lamination and bonding, or paste jetting/dispensing followed by lid or glass or laminate cover attach and sintering. Low temperature sintering enables assembly of high CTE mismatch stacks as well as temperature sensitive material stacks.

7. ACF Replacements. Arrays of bumps of the said material can be delivered to the substrate via stencil printing, bump transfer, or high speed jet dispensing. Such arrays can be used to serve as electrical contacts to assemble devices without explicit high degrees of alignment

The invention claimed is:

1. A sintering paste comprising:
a sintering powder of metal particles;
a solvent; and
a hydrogen peroxide or organic peroxide;
wherein the sintering powder of metal particles comprises:
from 1 to 10 wt % of a first type of metal particles having a mean longest dimension of from 100 nm to 20 µm, the metal particles at least partially coated with an oleic acid capping agent; and
from 90 to 99 wt % of a second type of metal particles having a mean longest dimension of from 5 to 75 nm, wherein the second type of metal particles are at least partially coated with an octylamine capping agent.

2. The sintering paste of claim 1 further comprising an epoxy-based resin.

3. The sintering paste of claim 1 wherein the solvent comprises at least one of a monoterpene alcohol, a glycol, or glycol ether.

4. The sintering paste of claim 1, comprising:
from 1 to 15 wt % binder;
from 1 to 30 wt % solvent;
up to 5 wt % rheology modifier;
up to 10 wt % an organosilver compound;
up to 2 wt % activator;
up to 6 wt % surfactant; and
from 0.5 wt % up to 2 wt % hydrogen peroxide or organic peroxides; and
balance of the sintering powder.

5. The sintering paste of claim 1 comprising:
from 1 to 30 wt % solvent;
up to 50 wt % organosilver compound;
up to 5 wt % rheology modifier;
up to 2 wt % activator;
up to 6 wt % surfactant; and
from 0.5 wt % up to 2 wt % hydrogen peroxide or organic peroxides; and
balance of the sintering powder.

6. The sintering paste of claim 1, further comprising one or more of silver oxalate, silver lactate, silver succinate, silver neodecanoate, silver citrate and silver stearate.

7. The sintering paste of claim 1, further comprising at least one of a fatty acid or a wetting agent.

8. The sintering paste of claim 1, wherein the paste is substantially resin free.

9. The sintering paste of any of claim 1, further comprising a film forming agent.

10. A method of die attachment comprising:
printing the sintering paste of claim 1 onto a sheet;
heating the paste to at least partially remove the solvent and form a sintering film;
placing said sintering film between a die and a substrate to be joined; and
sintering the sintering film.

11. The method of claim 10, wherein the sintering is carried out at a
temperature of from 150 to 400° C. for up to 120 minutes.

12. The method of claim 10, wherein the step of placing the sintering film between the die and the substrate to be joined comprises:

(a) applying the sintering film to the die to form an assembly having a die side and a sintering film side; and
(b) contacting the sintering film side of the assembly with the substrate.

13. The method of claim 12, wherein step (a) is carried out at a temperature of from 15 to 400° C. and a pressure of from 0.1 to 5 MPa for from 0.1 to 60 seconds.

14. The method of claim 12, wherein step (b) is carried out at a temperature of from 15 to 400° C. and a pressure of from 0.1 to 40 MPa for from 0.1 to 60 minutes.

15. The method of claim 10, wherein the sintering is carried out while applying a pressure of from 0.1 to 40 MPa.

16. A method of wafer bonding comprising:
printing the sintering paste of claim 1 onto a sheet;
heating the paste to at least partially remove the solvent and form a sintering film;
placing the sintering film between two or more wafers to be joined; and
sintering the sintering film,
wherein the sintering is carried out without the application of pressure.

17. A method of transferring a sintering film to a component, comprising:
printing the sintering paste of claim 1 onto a sheet;
heating the paste to at least partially remove the solvent and form a sintering film;
applying the sintering film to a substrate to form an assembly having a sintering film side and a substrate side;
contacting the sintering film side of the assembly with a component;
heating the assembly to a temperature of from 50 to 200° C.;
applying a pressure of from 1 to 5 MPa to the assembly for from 0.1 seconds to 60 minutes; and separating the substrate from the sintering film.

18. A method of manufacturing a sintered joint comprising the steps:
printing the sintering paste of claim 1 onto a sheet;
heating the paste to at least partially remove the solvent and form a sintering film;
providing the sintering film in a vicinity of two or more work pieces to be joined; and
heating the sintering film to at least partially sinter the metal particles.

19. The method of claim 18 wherein the heating is carried out at a temperature of at least 140° C.

20. The sintering paste of claim 1, consisting essentially of:
said sintering powder;
from 1 to 30 wt % solvent;
0.1 to 50 wt % organosilver compound;
up to 5 wt % rheology modifier;
up to 2 wt % activator;
up to 6 wt % surfactant;
from 0.5 wt % up to 2 wt % hydrogen peroxide or organic peroxides.

21. The sintering paste of claim 1 comprising from 0.5 to 2 wt. % of the hydrogen peroxide.

22. The sintering paste of claim 1 comprising from 0.5 to 2 wt. % of the organic peroxide.

23. The sintering paste of claim 1 comprising from 0.5 to 2 wt. % tertiary-butyl hydroperoxide or tertiary-butyl peroxy-2-ethylhexanoate.

24. The sintering paste of claim 1 comprising:
62 to 90 wt. % sintering powder;

1 to 30 wt % solvent;
0.1 to 25 wt % organosilver compound;
0 to 5 wt % rheology modifier;
0 to 2 wt % activator;
0 to 6 wt % surfactant; and
from 0.5 wt % up to 2 wt % hydrogen peroxide or organic peroxides.

25. A sintering paste comprising:
a sintering powder of metal particles; and
a solvent;
wherein the sintering powder of metal particles comprises:
from 1 to 10 wt % of a first type of metal particles having a mean longest dimension of from 100 nm to 20 μm, the first type of metal particles at least partially coated with an oleic acid capping agent; and
from 90 to 99 wt % of a second type of metal particles having a mean longest dimension of from 5 to 75 nm, wherein the second type of metal particles are at least partially coated with an octylamine capping agent.

26. The sintering paste of claim 25 wherein the sintering paste further comprises at least one of a binder, a rheology modifier, an organosilver compound, an activator, a surfactant, a wetting agent, hydrogen peroxide, and organic peroxide.

27. A method of die attachment comprising:
printing the sintering paste of claim 25 onto a sheet;
heating the paste to at least partially remove the solvent and form a sintering film;
placing said sintering film between a die and a substrate to be joined; and
sintering the sintering film.

28. The method of claim 27, wherein the sintering is carried out at a temperature of from 150 to 400° C. for up to 120 minutes.

29. The method of claim 27, wherein the step of placing the sintering film between the die and the substrate to be joined comprises:
(a) applying the sintering film to the die to form an assembly having a die side and a sintering film side; and
(b) contacting the sintering film side of the assembly with the substrate.

30. The method of claim 29, wherein step (a) is carried out at a temperature of from 15 to 400° C. and a pressure of from 0.1 to 5 MPa for from 0.1 to 60 seconds.

31. The method of claim 29, wherein step (b) is carried out at a temperature of from 15 to 400° C. and a pressure of from 0.1 to 40 MPa for from 0.1 to 60 minutes.

32. The method of claim 27, wherein the sintering is carried out while applying a pressure of from 0.1 to 40 MPa.

33. A method of wafer bonding comprising:
printing the sintering paste of claim 25 onto a sheet;
heating the paste to at least partially remove the solvent and form a sintering film;
placing the sintering film between two or more wafers to be joined; and
sintering the sintering film,
wherein the sintering is carried out without the application of pressure.

34. A method of transferring a sintering film to a component, comprising:
printing the sintering paste of claim 25 onto a sheet;
heating the paste to at least partially remove the solvent and form a sintering film;
applying the sintering film to a substrate to form an assembly having a sintering film side and a substrate side;
contacting the sintering film side of the assembly with a component;
heating the assembly to a temperature of from 50 to 200° C.;
applying a pressure of from 1 to 5 MPa to the assembly for from 0.1 seconds to 60 minutes; and separating the substrate from the sintering film.

35. A method of manufacturing a sintered joint comprising the steps:
printing the sintering paste of claim 25 onto a sheet;
heating the paste to at least partially remove the solvent and form a sintering film;
providing the sintering film in a vicinity of two or more work pieces to be joined; and
heating the sintering film to at least partially sinter the metal particles.

36. The method of claim 35, wherein the heating is carried out at a temperature of at least 140° C.

* * * * *